US011380398B2

(12) United States Patent
Seo et al.

(10) Patent No.: US 11,380,398 B2
(45) Date of Patent: Jul. 5, 2022

(54) STORAGE DEVICE AND THE READ OPERATING METHOD THEREOF

(71) Applicant: SAMSUNG ELECTRONICS CO., LTD., Suwon-si (KR)

(72) Inventors: Jun-Ho Seo, Hwaseong-si (KR); Suk-Eun Kang, Seoul (KR); Do Gyeong Lee, Suwon-si (KR); Ju Won Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/182,556

(22) Filed: Feb. 23, 2021

(65) Prior Publication Data

US 2022/0020433 A1     Jan. 20, 2022

(30) Foreign Application Priority Data

Jul. 17, 2020   (KR) .................... 10-2020-0088807

(51) Int. Cl.
| | |
|---|---|
| *G11C 16/34* | (2006.01) |
| *G11C 16/10* | (2006.01) |
| *G11C 16/28* | (2006.01) |
| *G11C 16/08* | (2006.01) |
| *G11C 16/30* | (2006.01) |

(52) U.S. Cl.
CPC ............. *G11C 16/10* (2013.01); *G11C 16/08* (2013.01); *G11C 16/28* (2013.01); *G11C 16/30* (2013.01); *G11C 16/3404* (2013.01)

(58) Field of Classification Search
CPC ......... G11C 16/10; G11C 16/08; G11C 16/28; G11C 16/30; G11C 16/3404
See application file for complete search history.

(56) References Cited

U.S. PATENT DOCUMENTS

| | | | |
|---|---|---|---|
| 7,372,730 B2 | 5/2008 | Chen | |
| 8,023,323 B2 | 9/2011 | Kang et al. | |
| 8,743,615 B2* | 6/2014 | Lee | .................... G11C 11/5642 |
| | | | 365/185.11 |
| 9,263,131 B2 | 2/2016 | Shibata | |
| 9,390,800 B2 | 7/2016 | Shiino et al. | |

(Continued)

FOREIGN PATENT DOCUMENTS

KR          20160095282 A          8/2016

*Primary Examiner* — Khamdan N. Alrobaie
(74) *Attorney, Agent, or Firm* — Volentine, Whitt & Francos, PLLC

(57) ABSTRACT

A storage device including a nonvolatile memory device that includes a nonvolatile memory cell array including a string including first and second memory cells stacked sequentially, and an OTP memory cell array that stores reference count values, the first and second memory cells respectively connected to first and second word lines; a controller including a processor that generates a read command for the first memory cell; a read level generator including a counter that receives the read command and calculates an off-cell count value of memory cells connected to the second word line, and a comparator that receives a first reference count value from the OTP memory cell array, compares the off-cell count value with the first reference count value to determine a threshold voltage shift of the second memory cell, and determines a read level of the first memory cell based on the threshold voltage shift.

20 Claims, 24 Drawing Sheets

(56) References Cited

U.S. PATENT DOCUMENTS

| | | | |
|---|---|---|---|
| 9,875,803 B2 | 1/2018 | Asami et al. | |
| 10,056,152 B2* | 8/2018 | Hahn | G11C 11/5671 |
| 10,528,420 B2* | 1/2020 | Kwak | G06F 11/1068 |
| 10,580,486 B2* | 3/2020 | Kim | G11C 16/0483 |
| 2014/0010017 A1* | 1/2014 | Lee | G11C 16/26 |
| | | | 365/185.18 |
| 2015/0049554 A1* | 2/2015 | Yim | G11C 16/3422 |
| | | | 365/185.18 |
| 2018/0294031 A1* | 10/2018 | Seo | G11C 16/10 |
| 2018/0294036 A1* | 10/2018 | Oh | G11C 29/028 |
| 2019/0267104 A1 | 8/2019 | Lee et al. | |
| 2019/0279724 A1 | 9/2019 | Itoh et al. | |
| 2020/0160906 A1* | 5/2020 | Lee | G11C 11/5635 |
| 2021/0335434 A1* | 10/2021 | Jung | G11C 16/30 |

* cited by examiner 200-2

US 11,380,398 B2

STORAGE DEVICE AND THE READ OPERATING METHOD THEREOF

A claim of priority under 35 U.S.C. § 119 is made to Korean Patent Application No. 10-2020-0088807, filed on Jul. 17, 2020, and all the benefits accruing therefrom under 35 U.S.C. § 119, the entirety of which is hereby incorporated by reference.

BACKGROUND

The present disclosure relates to storage devices and read operating methods of storage devices.

Storage devices such as SSD (solid state drive) include nonvolatile memory device(s) which may retain stored data even when power is cut off, and thus are advantageous for long-term data storage. Such storage devices including nonvolatile memory device(s) are typically used as primary storage in various electronic devices such as for example computers, smartphones, and smart pads and the like.

Nonvolatile memory devices of storage devices may deteriorate over time due to various causes, and such deterioration may be coped with by changing operating conditions depending on the degree of deterioration. For example, a level of read voltage (or a read level) may be adjusted according to the operating conditions in a storage device. However, in a nonvolatile memory cell array of a nonvolatile memory device, memory cells connected to different word lines may cause different changes in read voltage according to the deterioration. In order to ensure driving reliability of storage devices including nonvolatile memory device(s), more precise adjustment of the read voltage is thus necessary.

SUMMARY

Embodiments of the inventive concepts provide a storage device in which reading accuracy of memory cells is improved in view of changes in operating states of memory cells connected to a word line adjacent to a word line to which the read target memory cell is connected.

Embodiments of the inventive concepts also provide a read operating method of a storage device in which reading accuracy of memory cells is improved in view of changes in operating states of memory cells connected to a word line adjacent to a word line to which the read target memory cell is connected.

Embodiments of the inventive concepts provide a storage device including a nonvolatile memory device which includes a nonvolatile memory cell array including a string including a first memory cell and a second memory cell stacked sequentially in a first direction, and an OTP memory cell array that stores reference count values, the first memory cell connected to a first word line and the second memory cell connected to a second word line; a controller which includes a processor that generates a read command for the first memory cell; and a read level generator which includes a counter that receives the read command and calculates an off-cell count value of memory cells connected to the second word line, and a comparator which receives a first reference count value from among the reference count values stored in the OTP memory cell array, compares the off-cell count value with the first reference count value to determine a threshold voltage shift of the second memory cell, and determines a read level of the first memory cell based on the threshold voltage shift.

Embodiments of the inventive concepts further provide a storage device including a nonvolatile memory device which includes a nonvolatile memory cell array including a string including a first memory cell, a second memory cell and a string select transistor stacked sequentially in a first direction, and an OTP memory cell array including reference count values, the first memory cell connected to a first word line and the second memory cell connected to a second word line; a controller connected to the nonvolatile memory device through a voltage generator; and a read level generator which receives a read command for the first memory cell from the controller, generates a read level for the first memory cell, and transmits the read level to the controller. The nonvolatile memory device performs a read operation of the first memory cell responsive to the read command. The read level generator includes a counter that receives the read command and calculates an off-cell count value of memory cells connected to the second word line, and the read level generator further includes a comparator that receives a first reference count value from among the reference count values stored in the OTP memory cell array, compares the off-cell count value with the first reference count value to determine a threshold voltage shift of the second memory cell, and determines the read level of the first memory cell based on the threshold voltage shift.

Embodiments of the inventive concepts still further provide a storage device including a nonvolatile memory device which includes a nonvolatile memory cell array including a string including a first memory cell and a second memory cell stacked sequentially in a first direction, and an OTP memory cell array that stores reference count values, the first memory cell connected to a first word line and the second memory cell connected to a second word line; a counter which receives a read command for the first memory cell and calculates an off-cell count value of memory cells connected to the second word line; and a comparator which receives a first reference count value from among the reference count values stored in the OTP memory cell array, compares the off-cell count value with the first reference count value to determine a threshold voltage shift of the second memory cell, and determines a read level of the first memory cell based on of the threshold voltage shift.

Embodiments of the inventive concepts also provide a read operating method of a storage device including receiving, by a counter, a read command for a first memory cell from among the first memory cell and a second memory cell stacked sequentially in a first direction in a nonvolatile memory device, the first memory cell connected to a first word line and the second memory cell connected to a second word line; calculating, by the counter, an off-cell count value of memory cells connected to the second word line; receiving by a comparator, a first reference count value from among reference count values stored in an OTP memory cell array; comparing, by the comparator, the off-cell count value with the first reference count value to determine a threshold voltage shift of the second memory cell; and determining, by the comparator, a read level of the first memory cell based on the threshold voltage shift.

Embodiments of the inventive concepts still further provide a storage device including a nonvolatile memory device including a memory cell array connected to word lines; a controller that provides read command to control read operations of the nonvolatile memory device; and a read level generator that generates an off-cell count value of memory cells from among the memory cell array that are connected to a first word line from among the word lines responsive to the read command indicative of a request to read a target memory cell from among the memory cells that are connected to a second word line from among the word lines, compares the off-set count value to a first reference count value of the first word line, and determines a read level for reading the target memory cell based on the comparison result. The first word line is adjacent the second word line.

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
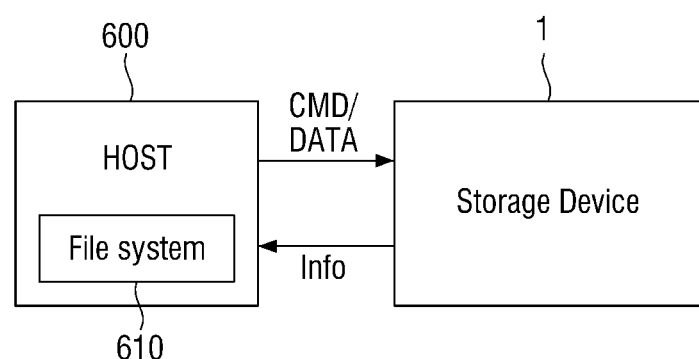
FIG. 1 illustrates a block diagram of a storage system according to embodiments of the inventive concepts.

FIG. 1 illustrates a block diagram of a storage system according to embodiments of the inventive concepts.

Referring to FIG. 1, the storage system according to some embodiments includes a storage device 1 and a host 600 located outside the storage device 1. Hereinafter, each configuration may be made up of separate chips, modules or devices, and may be included inside a single device. For example, the storage device 1 may be used by or configured as being connected to the separate host 600. However, the inventive concepts are not limited thereto, and the storage device 1 and the host 600 may be integrated into a single device.

The host 600 may be driven by executing an operating system (OS). The operating system may include a file system 610 for file management, and a device driver (not shown) for controlling a peripheral including a data storage device at the operating system level.

The file system 610 may manage file name, extension, file attributes, file size, cluster information, and the like of the files accessed at the request of the host 600. Also, file-based data may be generated, deleted, and managed by the file system 610. The device driver may be a software module of the kernel for controlling the data storage device. The host 600 may request a write operation and a read operation on the data storage device 1 through the device driver. In addition, the host 600 may execute for example video applications, game applications, Web browser applications, and the like to provide various services.

The host 600 may be, for example, an arbitrary electronic device, such as a PC (personal computer), a laptop, a mobile phone, a smart phone, a tablet PC, an MP3 player, a PDA (personal digital assistant), an EDA (enterprise digital assistant), a PMP (portable multimedia player), a digital camera, a music player, a portable game console, a navigation device, a wearable device, an IoT (internet of things) device, an IoE (internet of everything) device, an e-book, a VR (virtual reality) device, and an AR (augmented reality) device.

The host 600 may perform a read operation on a specific address in the storage device 1 through a command (CMD) to the storage device 1. Or, the host 600 may program data (DATA) at a specific address in the storage device 1 through the command (CMD) provided to the storage device 1.

The storage device 1 may transmit information (Info) stored at a specific address to the host 600 after receiving the read command from the host 600. Or, the storage device 1 may program data (DATA) at a specific address after receiving a program command from the host 600.

The storage device 1 according to some embodiments may be configured, but is not limited to, in the form of for example a solid state drive (SSD), a memory card, an eMMC® (embedded Multi Media Card), or a UFS (Universal Flash Storage) or the like. Hereinafter, the storage device 1 according to embodiments will be described in detail with reference to FIG. 2.

Figure 2:
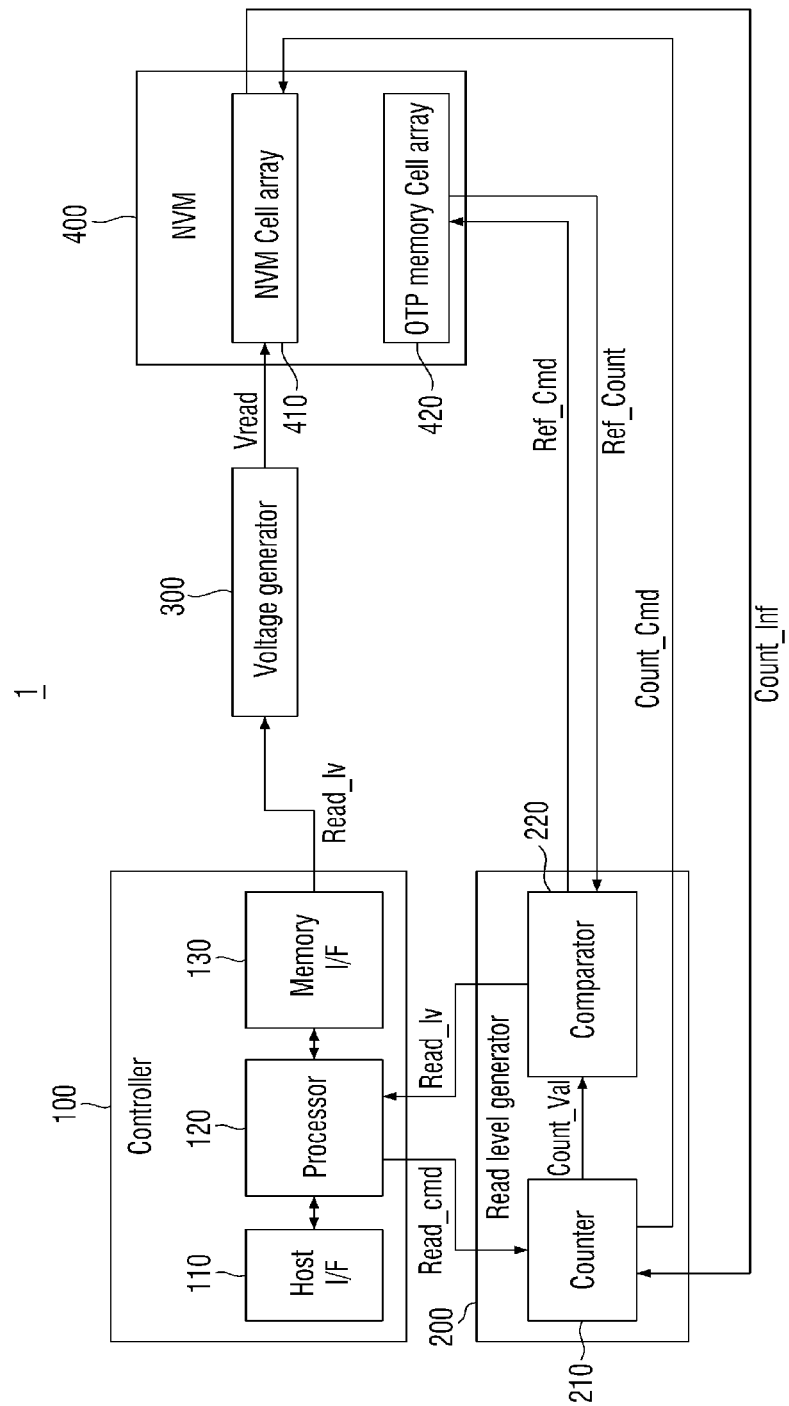
FIG. 2 illustrates a block diagram of a storage device according to embodiments of the inventive concepts.

FIG. 2 illustrates a block diagram of a storage device according to embodiments of the inventive concepts.

Referring to FIG. 2, the storage device 1 according to some embodiments includes a controller 100, a read level generator 200, a voltage generator 300, and a nonvolatile memory device 400.

The controller 100 may access to the voltage generator 300 and the read level generator 200. The controller 100 may access to the nonvolatile memory device 400 through the voltage generator 300 and the read level generator 200. The controller 100 may control the overall operation of the storage device 1 according to some embodiments.

For example, the controller 100 may perform a program operation, a read operation, or an erase operation at the request of an external device (e.g., host 600 of FIG. 1). The controller 100 may write the program-requested data in the nonvolatile memory device 400 and read the read-requested data from the nonvolatile memory device 400.

The controller 100 may include a processor (e.g., CPU 120), a host interface (I/F) 110, and a memory interface (I/F) 130. Hereinafter, other configurations and/or components/circuitry of the controller 100 are omitted for the sake of simplicity of drawing. For example, although not shown, the controller 100 may include a bus or a buffer interface.

The processor 120 may control all operations of the controller 100 and execute logical operations. The processor 120 may communicate with an external device (e.g., the host 600 of FIG. 1) through the host interface 110, and may communicate with the voltage generator 300 through the memory interface 130. Also, the processor 120 may communicate with the nonvolatile memory device 400 through the voltage generator 300 via the memory interface 130. When the processor 120 receives a read command from an external device (e.g., the host 600 of FIG. 1) through the host interface 110, the processor 120 may send a read command Read_cmd to the read level generator 200. More specifically, when the processor 120 receives the read command from an external device (e.g., the host 600 of FIG. 1) through the host interface 110, the processor 120 may send the read command Read_cmd to a counter 210 in the read level generator 200. At the time of the read operation, the controller 100 transmits the read level Read_lv, which is received from the read level generator 200, to the voltage generator 300, and may generate the read voltage Vread used by the nonvolatile memory device 400 through the voltage generator 300.

The host interface 110 may be configured to communicate with an external device (e.g., the host 600 of FIG. 1) under the control of the processor 120. The host interface 110 may be configured to perform communication, using at least one of various communication protocols such as for example USB (Universal Serial Bus), SATA (Serial AT Attachment), SAS (Serial Attached SCSI), HSIC (High Speed Interchip), SCSI (Small Computer System Interface), PCI (Peripheral Component Interconnection), PCIe (PCI express), NVMe® (NonVolatile Memory express), UFS (Universal Flash Storage), SD® (Secure Digital), MMC™ (MultiMedia Card), eMMC® (embedded MMC), DIMM (Dual In-line Memory Module), RDIMM (Registered DIMM) and LRDIMM (Load Reduced DIMM) and the like.

The memory interface 130 may be configured to communicate with the nonvolatile memory device 400 through the voltage generator 300 under the control of the processor 120. The memory interface 130 may send and receive commands, addresses, and data to and from the nonvolatile memory device 400 through I/O channels (not shown). The memory interface 130 may send and receive control signals to and from the nonvolatile memory device 400 through a control channel (not shown). Although it is not shown, the memory interface 130 may also include an error correction code (ECC) unit.

The voltage generator 300 may be configured to generate the various voltages required by the nonvolatile memory device 400. For example, the voltage generator 300 may generate a plurality of program voltages, a plurality of pass voltages, a plurality of selection read voltages, a plurality of non-selection read voltages, and the like. Also, the voltage generator 300 may generate a read voltage Vread to be applied to a read target memory cell, on the basis of the read level Read_lv generated by the read level generator 200.

The nonvolatile memory device 400 may include a nonvolatile memory (NVM) cell array 410 and an OTP (one time programmable) memory cell array 420. The nonvolatile memory cell array 410 may include a memory cell targeted by a read command Read_cmd. The nonvolatile memory cell array 410 may include, but is not limited to, for example flash memory, phase-change random access memory (PRAM), ferroelectric random access memory (FeRAM, Ferroelectric RAM), magnetic random access memory (MRAM, a Magnetic RAM), resistive random access memory (RRAM, Resistive RAM), and the like.

Figure 3:
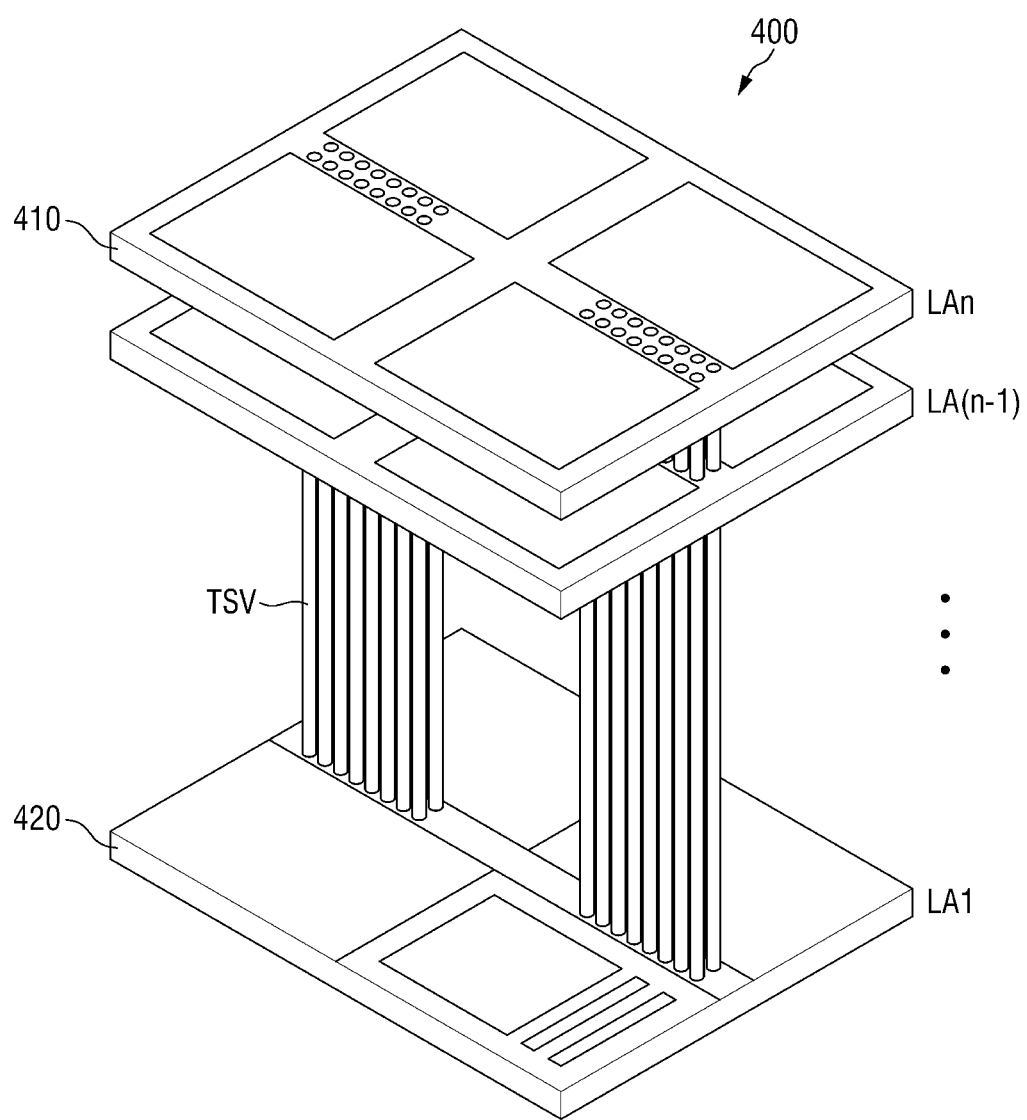
FIG. 3 illustrates a block diagram of a nonvolatile memory device of the storage device according to embodiments of the inventive concepts.

Although the nonvolatile memory device 400 may be configured, for example, as shown in FIG. 3, the configuration of the nonvolatile memory device 400 according to some embodiments is not limited to FIG. 3.

FIG. 3 illustrates a block diagram of a nonvolatile memory device of the storage device according to embodiments of the inventive concepts.

Referring to FIGS. 2 and 3, the nonvolatile memory device 400 of the storage device 1 according to some embodiments may include a plurality of semiconductor layers LA1, LA(n−1) to LAn. Each of the plurality of semiconductor layers LA1 to LAn may be a memory chip (e.g., a DRAM memory chip), or some of the plurality of semiconductor layers LA1 to LAn may be master chips that execute interfacing with an external device (e.g., the host 600 of FIG. 1), and the rest thereof may be slave chips that store data. For example, an $n^{th}$ layer LAn located at the uppermost end of the nonvolatile memory device 400 may be a semiconductor chip including the nonvolatile memory cell array 410. Further, a first layer LA1 located at the lowermost end of the nonvolatile memory device 400 may be a semiconductor chip including an OTP memory cell array 420. Each of the plurality of semiconductor layers LAn to LA1 may send and receive signals to and from each other through through-silicon vias TSV. The configuration and arrangement of the nonvolatile memory device 400 according to some embodiments are not limited thereto.

Referring to FIG. 2 again, the OTP memory cell array 420 may be used to repair the nonvolatile memory device 400. For example, after testing the nonvolatile memory device 400, by storing the characteristics of the nonvolatile memory device according to the test result in the OTP memory cell array 420, and by operating the nonvolatile memory device 400 on the basis of information stored in the OTP memory cell array 420, the operational reliability of the storage device 1 according to some embodiments can be improved.

More specifically, the OTP memory cell array 420 may for example store a value of a reference count Ref_count (which hereinafter may also be referred to as a reference count value Ref_Count). When the OTP memory cell array 420 receives a reference count request command Ref_Cmd from the read level generator 200, the OTP memory cell array 420 may send the reference count Ref_count to the read level generator 200. The value of reference count Ref_count may be a comparison target count value that is used to generate the read level Read_lv by the read level generator 200.

The storage device 1 according to some embodiments may adjust the read voltage Vread of the memory cell targeted by a read command Read_cmd by using the read level generator 200. More specifically, the read level generator 200 may generate the read level Read_lv of the memory cell targeted by the read command Read_cmd, in accordance with changes in the read level due to various deteriorations that occur in the nonvolatile memory device 400. That is, the read level generator 200 receives a read command Read_cmd from the processor 120, sends a reference command Ref_Cmd to the OTP memory cell array 420, and may receive the value of reference count Ref_count. Also, the read level generator 200 sends a count command Count_Cmd to the nonvolatile memory cell array 410, and receives threshold voltage information Count_inf of the memory cells connected to an adjacent word line that is adjacent to the word line connected to the memory cell targeted by the read command Read_cmd. After that, the read level generator 200 calculates an off-cell count value Count_Val of the memory cells connected to the adjacent word line through the threshold voltage information Count_inf, and may generate the read level Read_lv by comparing the off-cell count value Count_Val with the value of reference count Ref_count.

In the nonvolatile memory cell array 410 of the nonvolatile memory device 400, there may be a problem of reliability deterioration between the word lines in the nonvolatile memory cell array 410 as the number of stages of word lines increases. There may be various causes of reliability deterioration such as for example charge loss, coupling and back pattern dependency.

The deterioration problem that occurs in the nonvolatile memory cell array 410 will be described in detail with reference to FIGS. 4 to 7 hereinafter.

Figure 4:
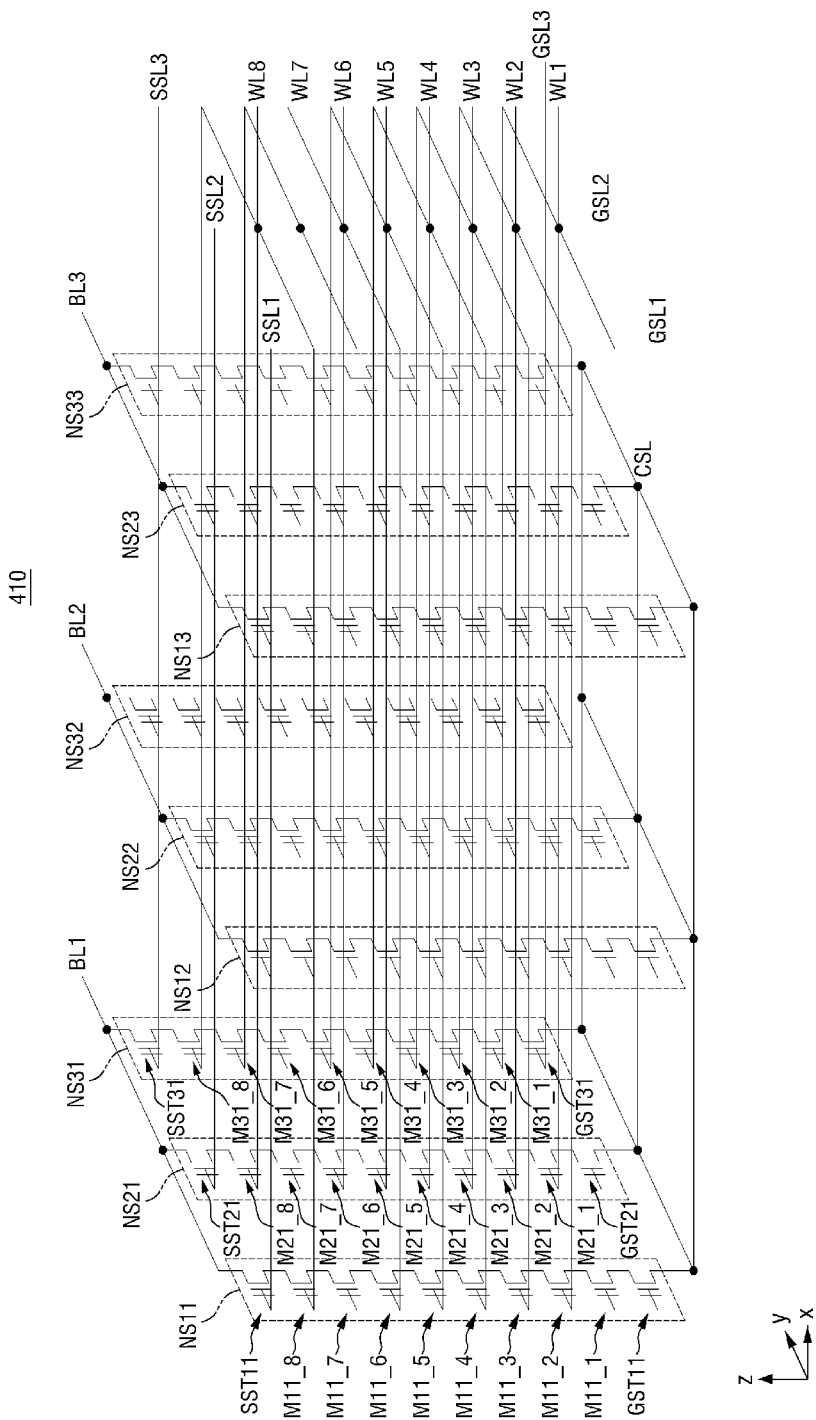
FIG. 4 illustrates a circuit diagram of the nonvolatile memory cell array of the storage device according to embodiments of the inventive concepts.

FIG. 4 illustrates a diagram of the nonvolatile memory cell array of the storage device according to embodiments of the inventive concepts.

Referring to FIG. 4, a plurality of cell strings NS11, NS21, NS31, NS12, NS22, NS32, NS13, NS23, and NS33 may be arranged on a substrate (not shown) in a first direction x and a second direction y. The plurality of cell strings NS11, NS21, NS31, NS12, NS22, NS32, NS13, NS23, and NS33 may have a form extending in a third direction z. The plurality of cell strings NS11, NS21, NS31, NS12, NS22, NS32, NS13, NS23, and NS33 may be connected in common to a common source line (CSL) formed on or inside the substrate (not shown). The common source line (CSL) is shown as being connected to the lowermost ends of the plurality of cell strings NS11, NS21, NS31, NS12, NS22, NS32, NS13, NS23, and NS33 in the third direction z. However, the common source line CSL may be electrically connected to the lowermost ends of the plurality of cell strings NS11, NS21, NS31, NS12, NS22, NS32, NS13, NS23, and NS33 in the third direction z, and is not limited as being physically located at the lowermost ends of the plurality of cell strings NS11, NS21, NS31, NS12, NS22, NS32, NS13, NS23, and NS33. Also, although the plurality of cell strings NS11, NS21, NS31, NS12, NS22, NS32, NS13, NS23, and NS33 are shown as being in a 3×3 arrangement in in FIG. 4, the arrangement form and number of the plurality of cell strings inside the nonvolatile memory cell array 410 are not limited thereto.

Some cell strings NS11, NS12, and NS13 may be connected to a first ground select line (GSL) GSL1. Some cell strings NS21, NS22, and NS23 may be connected to a second ground select line GSL2. Some cell strings NS31, NS32, and NS33 may be connected to a third ground select line GSL3.

Also, some cell strings NS11, NS12, and NS13 may be connected to a first string select line (SSL) SSL1. Some cell strings NS21, NS22, and NS23 may be connected to a second string select line SSL2. Some cell strings NS31, NS32, and NS33 may be connected to a third string select line SSL3.

The plurality of cell strings NS11, NS21, NS31, NS12, NS22, NS32, NS13, NS23, and NS33 includes a string select transistor (SST) connected to each of the string select lines. Also, each of the plurality of cell strings NS11, NS21, NS31, NS12, NS22, NS32, NS13, NS23, and NS33 includes a ground select transistor (GST) connected to each ground select line. One end of the ground select transistor of each of the plurality of cell strings NS11, NS21, NS31, NS12, NS22, NS32, NS13, NS23, and NS33 may be connected to the common source line CSL. Also, each of the plurality of cell strings NS11, NS21, NS31, NS12, NS22, NS32, NS13, NS23, and NS33 may have a plurality of memory cells sequentially stacked in the third direction z between the ground select transistor and the string select transistor. Although not shown in this drawing, each of the plurality of cell strings NS11, NS21, NS31, NS12, NS22, NS32, NS13, NS23, and NS33 may include a dummy cell between the ground select transistor and the string select transistor. Further, the number of string select transistors included in each string is not limited to the number as shown in FIG. 4, and an additional string select transistor may be included in each string.

For example, the cell string NS11 may include a ground select transistor GST11 placed at the lowermost end in the third direction z, a plurality of memory cells M11_8 to M11_1 sequentially stacked in the third direction z on the ground select transistor GST11, and a string select transistor SST11 stacked in the third direction z on the uppermost memory cell M11_8. Further, the cell string NS21 may include a ground select transistor GST21 placed at the lowermost end in the third direction z, a plurality of memory cells M21_1 to M21_8 sequentially stacked in the third direction z on the ground select transistor GST21, and a string select transistor SST21 stacked in the third direction z on the uppermost memory cell M21_8. Further, the cell string NS31 may include a ground select transistor GST31 placed at the lowermost end in the third direction z, a plurality of memory cells M31_1 to M31_8 sequentially stacked in the third direction z on the ground select transistor GST31, and a string select transistor SST31 stacked in the third direction z on the uppermost memory cell M31_8. The configuration of the other strings may be similar.

Memory cells located at the same height in the third direction z from the substrate (not shown) or the ground select transistor may be electrically connected in common through respective word lines. For example, memory cells of the height at which memory cells M11_1, M21_1, and M31_1 are formed may be connected to a first word line WL1. Further, memory cells of the height at which the memory cells M11_2, M21_2, and M31_2 are formed may be connected to a second word line WL2. Hereinafter, because the arrangement and structure of the memory cells connected to a third word line WL3 to an eighth word line WL8 are also similar, further description will be omitted for the sake of brevity.

One end of the string select transistor of each of the plurality of cell strings NS11, NS21, NS31, NS12, NS22, NS32, NS13, NS23, and NS33 may be connected to corresponding bit lines BL1, BL2, and BL3. For example, the string select transistors SST11, SST21, and SST31 may be connected to a bit line BL1 extending in the second direction y. Because the arrangement and configuration of other string select transistors connected to the bit lines BL2 and BL3 are similar, further description will be omitted for the sake of brevity.

Memory cells corresponding to one string (or ground) select line and one word line may form one page. A write operation and a read operation may be performed on a page basis. Each memory cell of each page may also store two or more bits. Bits to be written in the memory cells of each page may form logical pages.

The nonvolatile memory cell array 410 may be provided as a three-dimensional memory array. A 3D memory array may be monolithically formed at one or more physical levels of the arrays of memory cells having an active region placed on a substrate (not shown) or a circuit associated with the operation of the memory cells. The circuits associated with the operation of memory cells may be located inside or over the substrate. Monolithic formation means that layers of each level of the 3D array may be deposited directly on the lower level layers of the 3D array. Or, a circuit associated with the operation of the memory cells may be connected to the uppermost contact portion in the third direction z. This will be described in detail with reference to FIG. 5.

Figure 5:
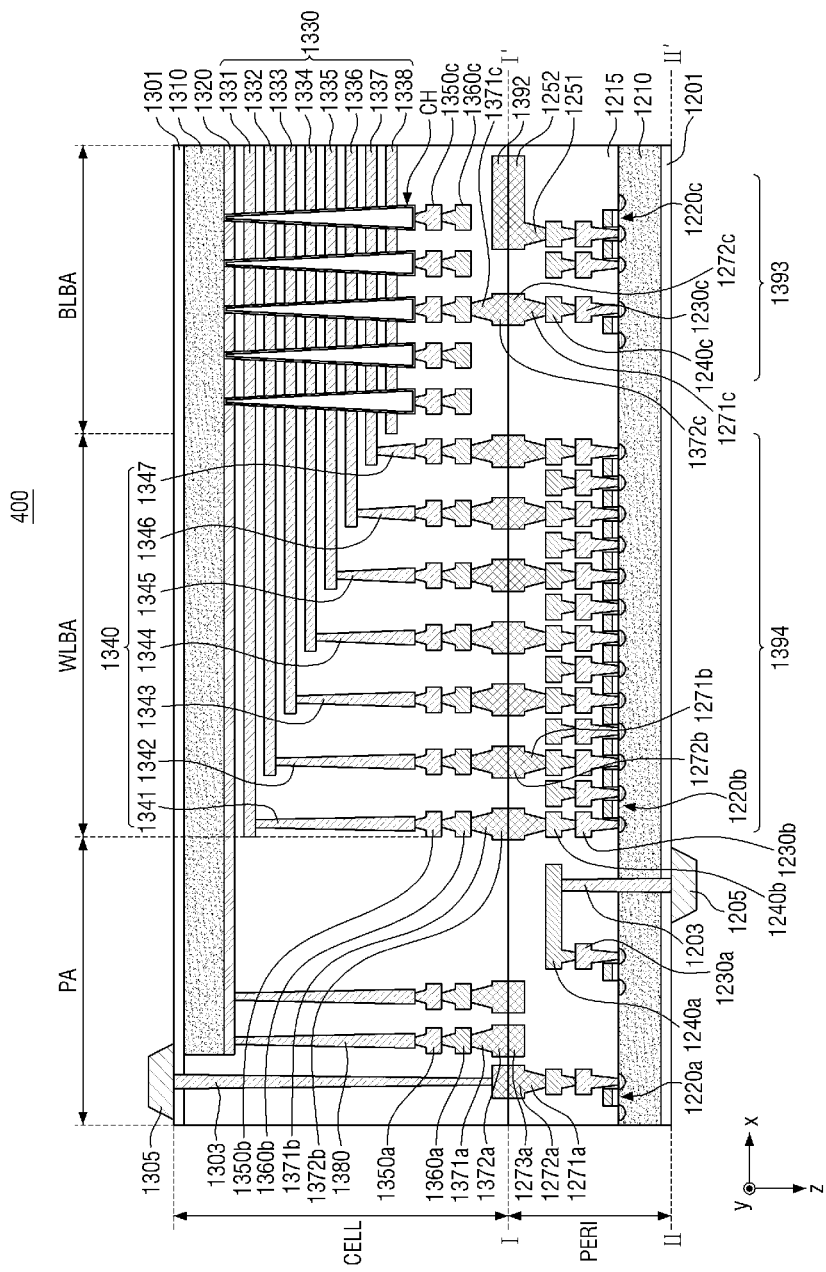
FIG. 5 illustrates a structural cross-sectional view of the nonvolatile memory device of the storage device according to embodiments of the inventive concepts.

FIG. 5 illustrates a structural cross-sectional view of the nonvolatile memory device of the storage device according to embodiments of the inventive concepts.

Referring to FIG. 5, the nonvolatile memory device 400 according to some embodiments may have a C2C (chip to chip) structure. In FIG. 5 a cell region CELL of the nonvolatile memory device 400 may correspond to the nonvolatile memory cell array 410 of FIG. 4. The C2C structure may mean that an upper chip including the cell region CELL is manufactured on a first wafer, a lower chip including a peripheral circuit region PERI is manufactured on a second wafer different from the first wafer, and then the upper chip and the lower chip are connected to each other by a bonding way. As an example, the bonding way may mean a way of electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding, and the bonding metal may also be formed of aluminum or tungsten.

Each of the peripheral circuit region PERI and the cell region CELL of the nonvolatile memory device 400 according to some embodiments may include an external pad bonding region PA, a word line bonding region WLBA, and a bit line bonding region BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c connected to each of the plurality of circuit elements 1220a, 1220b, and 1220c, and second metal layers 1240a, 1240b, and 1240c formed on the first metal layers 1230a, 1230b, and 1230c. In an embodiment, the first metal layers 1230a, 1230b, and 1230c may be formed of tungsten which has a relatively high resistance, and the second metal layers 1240a, 1240b, and 1240c may for example be made of copper which has a relatively low resistance.

Although only the first metal layers 1230a, 1230b, and 1230c and the second metal layers 1240a, 1240b, and 1240c are shown and described, other embodiments are not limited thereto and at least one or more metal layers may be further formed on the second metal layers 1240a, 1240b, and 1240c. At least some of one or more metal layers formed on the second metal layers 1240a, 1240b, and 1240c may for example be formed of aluminum or the like which has a lower resistance than copper forming the second metal layers 1240a, 1240b, and 1240c.

The interlayer insulating layer 1215 is placed on the first substrate 1210 to cover the plurality of circuit elements 1220a, 1220b, and 1220c, the first metal layers 1230a, 1230b, and 1230c, and the second metal layers 1240a, 1240b, and 1240c, and may include insulating materials such as for example silicon oxide, silicon nitride and the like.

Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to the upper bonding metals 1371b and 1372b of the cell region CELL by the bonding way. The lower bonding metals 1271b and 1272b and the upper bonding metals 1371b and 1372b may for example be formed of aluminum, copper, tungsten, or the like.

The cell region CELL may provide at least one memory block. The cell region CELL may include a second substrate 1310 and a common source line 1320 (corresponding to CSL of FIG. 4). A plurality of word lines (1331 to 1338) generally denoted as 1330 and corresponding to WL1 to WL8 of FIG. 4 may be stacked on the second substrate 1310, along the third direction z perpendicular to the upper surface of the second substrate 1310. The string select line(s) and the ground select line may be placed at each of the upper part and the lower part of the word lines 1330, and a plurality of word lines 1330 may be placed between the string select line and the ground select line.

In the bit line bonding region BLBA, the channel structure CH extends in the direction perpendicular to the upper surface of the second substrate 1310 and may penetrate the word lines 1330, the string select line(s), and the ground select line. The channel structure CH may include a data storage layer, a channel layer, a buried insulating layer, etc., and the channel layer may be electrically connected to a first metal layer 1350c and a second metal layer 1360c. For example, the first metal layer 1350c may be a bit line contact, and the second metal layer 1360c may be a bit line (corresponding to BL1 to BL3 of FIG. 4). In an embodiment, the bit line 1360c may extend along the second direction y parallel to the upper surface of the second substrate 1310.

In an embodiment shown in FIG. 5, the region in which the channel structure CH and the bit line 1360c are placed may be defined as a bit line bonding region BLBA. The bit line 1360c may be electrically connected to circuit elements 1220c that configure a page buffer 1393 in the peripheral circuit region PERI in the bit line bonding region BLBA. As an example, the bit line 1360c is connected to the upper bonding metals 1371c and 1372c in the cell region CELL, and the upper bonding metals 1371c and 1372c may be connected to the lower bonding metals 1271c and 1272c connected to the circuit elements 1220c of the page buffer 1393.

In the word line bonding region WLBA, the word lines 1330 may extend along the first direction x parallel to the upper surface of the second substrate 1310, and may be connected to a plurality of cell contact plugs (1341 to 1347) generally denoted as 1340. The word lines 1330 and the cell contact plugs 1340 may be connected to each other by pads provided by extending at least some of the word lines 1330 along the first direction x with different lengths. A first metal layer 1350b and a second metal layer 1360b may be connected sequentially to the upper part of the cell contact plugs 1340 connected to the word lines 1330. The cell contact plugs 1340 may be connected to the peripheral circuit region PERI through the upper bonding metals 1371b and 1372b of the cell region CELL and the lower bonding metals 1271b and 1272b of the peripheral circuit region PERI in the word line bonding region WLBA.

The cell contact plugs 1340 may be electrically connected to circuit elements 1220b that configure a row decoder 1394 in the peripheral circuit region PERI. In an embodiment, the operating voltage of the circuit elements 1220b that configure the row decoder 1394 may differ from the operating voltage of the circuit elements 1220c that configure the page buffer 1393. As an example, the operating voltage of the circuit elements 1220c that configure the page buffer 1393 may be greater than the operating voltage of the circuit elements 1220b that configure the row decoder 1394.

A common source line contact plug 1380 may be placed inside the external pad bonding region PA. The common source line contact plug 1380 may be formed of a conductive material such as metal, a metal compound, or polysilicon, and may be electrically connected to the common source line 1320. A first metal layer 1350a and a second metal layer 1360a may be sequentially stacked on the common source line contact plug 1380. As an example, the region in which the common source line contact plug 1380, the first metal layer 1350a, and the second metal layer 1360a are located may be defined as an external pad bonding region PA.

On the other hand, I/O pads 1205 and 1305 may be placed in the external pad bonding region PA. Referring to FIG. 5, a lower insulating film 1201 that covers the lower surface of the first substrate 1210 may be formed on the lower part of the first substrate 1210, and the first I/O pad 1205 may be formed on the lower insulating film 1201. The first I/O pad 1205 is connected to at least one of a plurality of circuit elements 1220a, 1220b, and 1220c placed in the peripheral circuit region PERI through the first I/O contact plug 1203, and may be separated from the first substrate 1210 by the lower insulating film 1201. Further, a side insulating film (not shown) may be placed between the first I/O contact plug 1203 and the first substrate 1210 to electrically separate the first I/O contact plug 1203 and the first substrate 1210.

Referring to FIG. 5, an upper insulating film 1301 that covers the upper surface of the second substrate 1310 may be formed on the upper part of the second substrate 1310, and a second I/O pad 1305 may be placed on the upper insulating film 1301. The second I/O pad 1305 may be connected to at least one of a plurality of circuit elements 1220a, 1220b, and 1220c placed in the peripheral circuit region PERI through the second I/O contact plug 1303, the upper bonding metal 1372a and the lower bonding metals 1272a and 1272b.

According to the embodiments, the second substrate 1310 and the common source line 1320 may not be placed in the region in which the second I/O contact plug 1303 is placed. Also, the second I/O pad 1305 may not overlap the word lines 1380 in the third direction z. Referring to FIG. 5, the second I/O contact plug 1303 is separated from the second substrate 1310 in a direction parallel to the upper surface of the second substrate 1310, penetrates the interlayer insulating layer 1315 of the cell region CELL, and may be connected to the second I/O pad 1305.

According to the embodiments, the first I/O pad 1205 and the second I/O pad 1305 may be selectively formed. As an example, the nonvolatile memory device 400 according to some embodiments may include only a first I/O pad 1205 placed on the upper part of the first substrate 1201, or may include only a second I/O pad 1305 placed on the upper part of the second substrate 1301. Also, the memory device 400 may include both the first I/O pad 1205 and the second I/O pad 1305.

The metal pattern of the uppermost metal layer may exist as a dummy pattern in each of the external pad bonding region PA and the bit line bonding region BLBA included in each of the cell region CELL and the peripheral circuit region PERI, or the uppermost metal layer may be omitted.

In the peripheral pad bonding region PA of the nonvolatile memory device 400 according to some embodiments, a lower metal pattern 1273a having the same shape as the upper metal pattern 1372a of the cell region CELL may be formed on the uppermost metal layer of the circuit region PERI to correspond to an upper metal pattern 1372a formed on the uppermost metal layer of the cell region CELL. The lower metal pattern 1273a formed on the uppermost metal layer of the peripheral circuit region PERI may be unconnected to another contact in the peripheral circuit region PERI. Similarly, in the external pad bonding region PA, an upper metal pattern having the same shape as the lower metal pattern of the peripheral circuit region PERI may also be formed on the upper metal layer of the cell region CELL, to correspond to the lower metal pattern formed on the uppermost metal layer of the peripheral circuit region PERI.

Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to the upper bonding metals 1371b and 1372b of the cell region CELL by the bonding way.

Further, in the bit line bonding region BLBA, an upper metal pattern 1392 having the same shape as the lower metal pattern 1252 of the peripheral circuit region PERI may be formed on the uppermost metal layer of the cell region CELL to correspond to the lower metal pattern 1252 formed on the uppermost metal layer of the peripheral circuit region PERI. The lower metal pattern 1252 may be connected to the plurality of circuit elements 1220c by lower bonding metal 1251. A contact may not be formed on the upper metal pattern 1392 formed on the uppermost metal layer of the cell region CELL.

Referring to FIG. 4 again, the nonvolatile memory cell array 410 may deteriorate over time and the threshold voltage distribution of the memory cells may change. Changes in the threshold voltage distribution of the memory cells due to deterioration will be described with reference to FIGS. 6A-6C and 7A-7C.

Figure 6A:
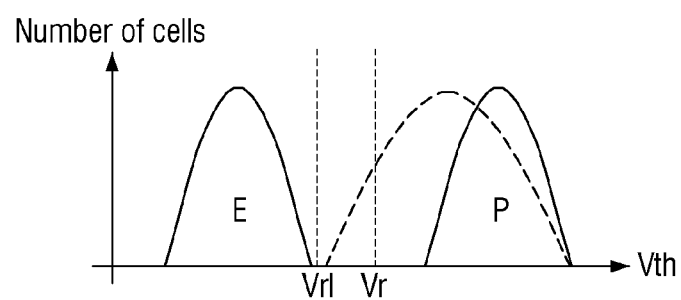
FIGS. 6A, 6B and 6C illustrate graphs showing changes in threshold voltage distribution of memory cells of the storage device according to embodiments of the inventive concepts.
Figure 6B:
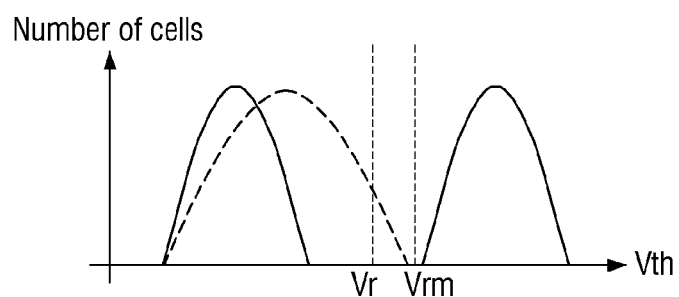
Figure 6C:
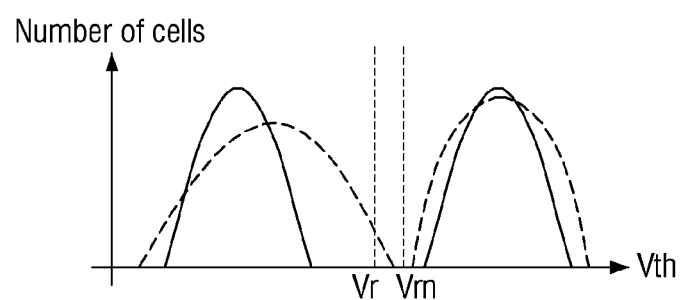

FIGS. 6A, 6B and 6C illustrate graphs showing changes in the threshold voltage distribution of the memory cells of the storage device according to embodiments of the inventive concepts.

Referring to FIGS. 2 and 6A-6C, examples in which the threshold voltage distribution of the memory cells change according to a specific deterioration factor will be hereinafter described. A horizontal axis of each graph may be defined as a threshold voltage Vth of the memory cells, and a vertical axis may be defined as the number of memory cells. For convenience of explanation, it is assumed that the memory cells are a single level cell SLC. A single level cell may have an erase state E or a program state P depending on the threshold voltage.

Referring to the graphs of FIGS. 6A-6C, a solid line represents an initial state of the threshold voltage distribution. The erase state E and the program state P may be distinguished using an initial read voltage Vr. In the initial state, a read margin sufficient for distinguishing each state may be secured between the erase state E and the program state P.

The threshold voltage distribution shown by the dotted line represents a state in which the initial state of the threshold voltage distribution changes due to some deterioration factors. Some deterioration factors may include factors that occur in a fabricating step of the storage device 1 or a usage step of the storage device 1 according to some embodiments. Due to some deterioration factors mentioned above, defects may occur in the memory cells in the memory cell array.

Referring to graph of FIG. 6A, a distribution deformation may occur in a direction in which the threshold voltage of the program state P decreases. As an example, when the operating temperature of the nonvolatile memory device 400 increases, trapped charge may be lost, and the threshold voltage of the program state P may be reduced. As a result, it may be difficult to distinguish between the erase state E and the program state P at the initial read voltage Vr. Therefore, in the case of FIG. 6A, the read operation needs to be performed by adjusting the initial read voltage Vr to a first read voltage Vrl.

Referring to graph of FIG. 6B, distribution deformation may occur in the direction in which the threshold voltage of the erase state E increases. As an example, when the number of reading times of the memory cell increases, charge trap may occur in the cell of the erase state due to read disturbance, and the threshold voltage of the erase state E may increase. As an example, when the number of writing times of the memory cell increases, deterioration due to tunnel oxide may occur, and the threshold voltage of the erase state E may increase. As a result, it may be difficult to distinguish between the erase state E and the program state P at the initial read voltage Vr. Therefore, in the case of FIG. 6B, the read operation needs to be performed by adjusting the initial read voltage Vr to a second read voltage Vrm.

Referring to graph of FIG. 6C, distribution deformation may occur so that the threshold voltage range of the erase state E and the program state P becomes wider. As an example, when the program/erase cycle (PE Cycle) of the nonvolatile memory device 400 increases, or when the retention time increases, charges captured in the memory cell may leak, and the threshold voltage range may be changed. As a result, it may be difficult to distinguish between the erase state E and the program state P at the initial read voltage Vr. Therefore, in the case of FIG. 6C, the read operation needs to be performed by adjusting the initial read voltage Vr to a third read voltage Vrn.

The storage device 1 according to some embodiments determines changes in the threshold voltage distribution due to the above-mentioned deterioration factors that occur in the word line to which the memory cell targeted by the read command is connected, and the memory cells connected to the adjacent word line. Further, the storage device 1 according to some embodiments may determine the read voltage of the memory cell targeted by the read command, on the basis of the distribution of the threshold voltage change that occurs in the word line to which the memory cell targeted by the read command is connected, and the memory cells connected to the adjacent word line.

Figure 7A:
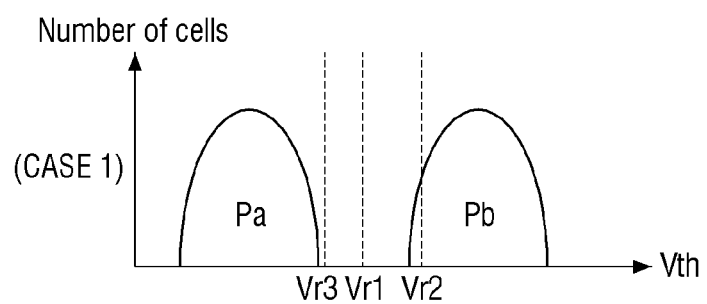
FIGS. 7A, 7B and 7C illustrate graphs showing changes in threshold voltage distribution of memory cells of the storage device for each situation along the word line according to embodiments of the inventive concepts.
Figure 7B:
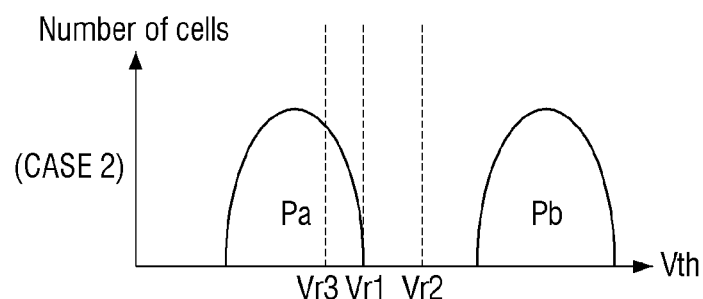
Figure 7C:
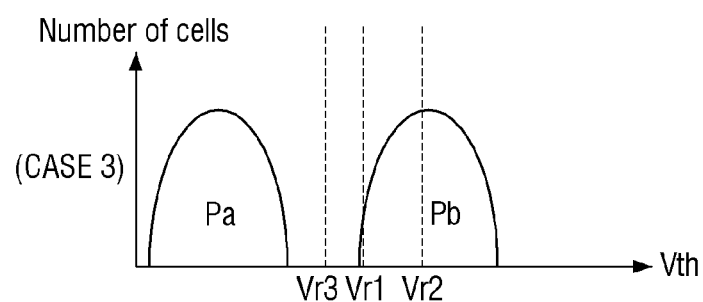

FIGS. 7A-7C illustrate graphs showing changes in the threshold voltage distribution of the memory cells of the storage device for each situation along the word line according to embodiments of the inventive concepts.

Referring to FIGS. 2 and 7A-7C, the threshold voltage distribution of the memory cells connected to different word lines is shown.

For example, a graph CASE 1 shown in FIG. 7A may be a threshold voltage distribution of the memory cells connected to the first word line WL1, a graph CASE 2 shown in FIG. 7B may be a threshold voltage distribution of memory cells connected to the second word line WL2, and a graph CASE 3 shown in FIG. 7C may be a threshold voltage distribution of memory cells connected to the third word line WL3. For the memory cells connected to the first word line WL1, a first program state Pa and a second program state Pb may be identified using the first read voltage Vr1. Also, for the memory cells connected to the second word line WL2, the first program state Pa and the second program state Pb may be identified using the second read voltage Vr2. Also, for the memory cells connected to the third word line WL3, the first program state Pa and the second program state Pb may be identified using the third read voltage Vr3.

Even memory cells included in the same memory block may have threshold voltage distributions different from each other. For example, the memory cells connected to each of the first word line WL1 to the third word line WL3 for connecting the memory cells included in the same memory block may have threshold voltage distributions different from each other. In this case, an optimum read voltage for distinguishing between the first program state Pa and the second program state Pb may be different for each word line. That is, the first read voltage Vr1 and the third read voltage Vr3 may be different from each other. When the same read voltage is provided to the memory cells included in the nonvolatile memory cell array 410, the first program state Pa or the second program state Pb may not be distinguished depending on the memory cells.

As an example, the threshold voltage distributions may be different from each other depending on the location of the memory cells. For example, referring to FIGS. 4 and 5, in the fabricating process of the cell string CS, the cross-sectional area parallel to the upper surface of the substrate may be formed to be smaller in view of the width of the pillar, as the distance from the substrate decreases. Therefore, when a voltage is applied to the memory cell adjacent to the substrate through the word line, the electric field formed in the memory cell adjacent to the substrate may be greater than the electric field formed in the memory cell distant from the substrate. This may affect read interference and may cause deterioration states different from each other on a word line basis. In addition, the degree of deterioration due to various deterioration factors such as retention time, program/erase cycle, and temperature may vary depending on the location of the memory cell. The memory cells connected to the same word line may have substantially similar deterioration states with respect to each other, because the distance from the substrate, the width of adjacent pillars, and the like are substantially constant. Also, since the distance between each word line is substantially constant, each memory region connected to different word lines may have a certain correlation depending on the deterioration. The storage device 1 according to some embodiments may generate a read voltage to be applied to the read target word line, on the basis of the threshold voltage distribution of the word line adjacent to the read target word line.

Referring to FIG. 2 again, thus, an off-cell count value Count_Val of the memory cells of the word line adjacent to the word line connected to the memory cell targeted by the read command Read_cmd is calculated through the read level generator 200, the off-cell count value Count_Val is compared with the value of reference count Ref_count to grasp the degree of deterioration of the adjacent word line, and the read voltage Vread applied to the memory cell targeted by the read command Read_cmd is adjusted in advance, thereby improving the read accuracy of the memory cell targeted by the read command Read_cmd.

The operation of the storage device 1 according to some embodiments will be described below with reference to FIG. 8.

Figure 8:
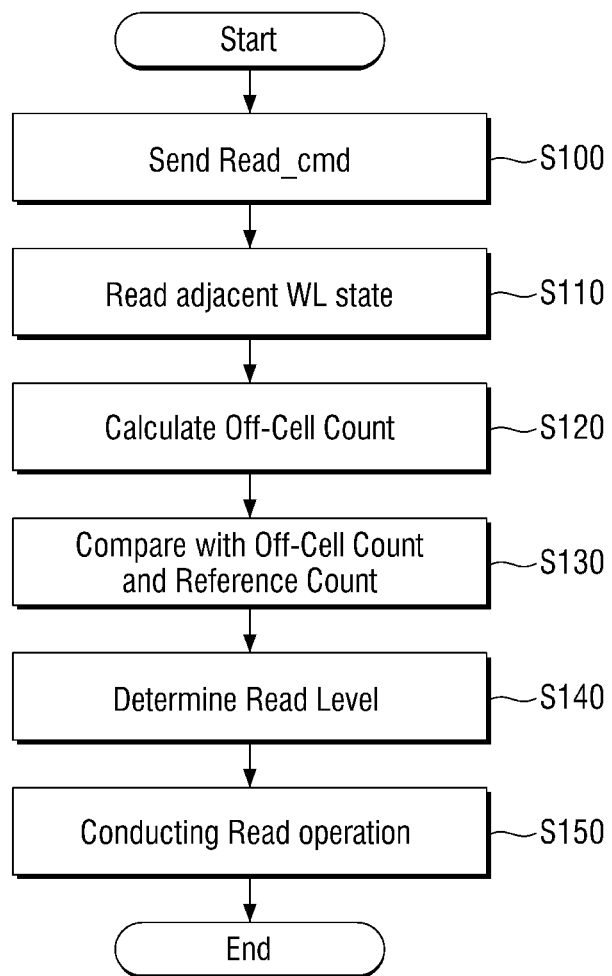
FIG. 8 illustrates a flowchart of a read operation of the storage device according to embodiments of the inventive concepts.

FIG. 8 illustrates a flowchart of a read operation of the storage device according to embodiments of the inventive concepts.

Referring to FIGS. 2 and 8, the storage device 1 according to some embodiments starts a read operation according to reception of a read command from an external device (for example, the host 600 of FIG. 1). Hereinafter, for convenience of explanation, an example is provided on the assumption that the word line, to which the memory cell targeted by the read command is connected, is a sixth word line WL6, and the word line adjacent to the word line, to which the memory cell targeted by the read command is connected, is a fifth word line WL5.

First, according to some embodiments the controller 100 of the storage device 1, more specifically the processor 120, sends a read command Read_cmd to the read level generator 200, more specifically to the counter 210 (S100). After that, the read level generator 200 reads the state of the fifth word line WL5 (S110). At this time, first, the counter 210 sends a count command Count_Cmd to the nonvolatile memory cell array 410, and receives count information Count_inf including the threshold voltage distribution information of the fifth word line WL5. The counter 210 calculates (determines) the off-cell count value Count_Val of the fifth word line WL5 on the basis of the received count information Count_inf (S120). The method by which the counter 210 calculates the off-cell count value of the fifth word line WL5 is described hereinafter as an example with reference to FIG. 9.

Figure 9:
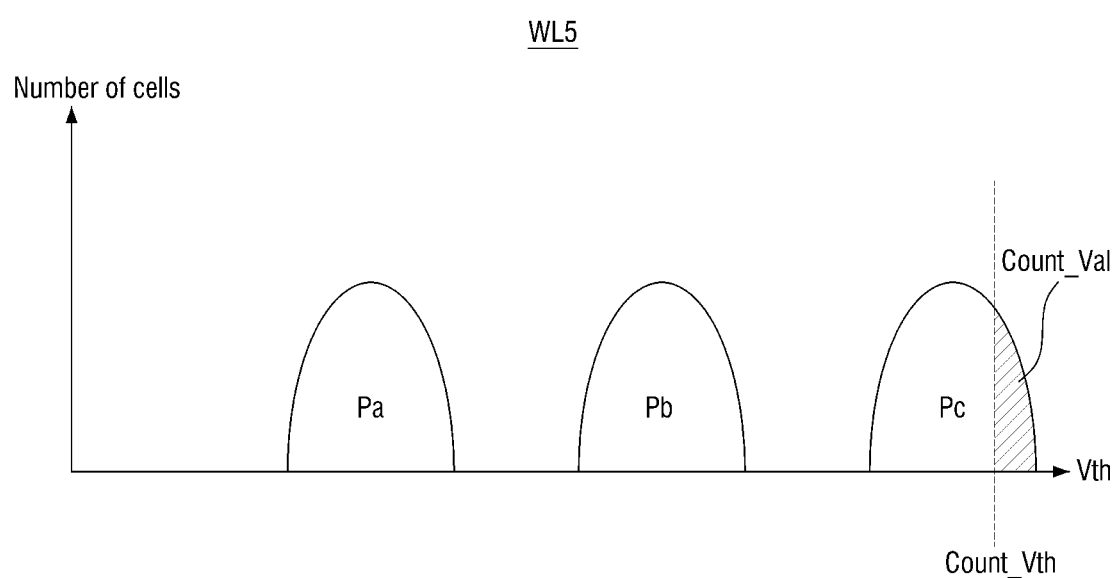
FIG. 9 illustrates a diagram showing how the storage device calculates the off-cell count value according to embodiments of the inventive concepts.

FIG. 9 illustrates a diagram showing how the storage device calculates off-cell count value according to embodiments of the inventive concepts.

Referring to FIGS. 2 and 9, the memory cells connected to the fifth word line WL5 are assumed to be multi-level cells MLC, and the threshold voltage distribution of the erase state E is omitted for the sake of simplicity of drawings.

The counter 210 may calculate the off-cell count value Count_Val of the state (e.g., the third state Pc) having the highest threshold voltage distribution of the memory cells connected to the fifth word line WL5. For example, the counter 210 may calculate the number of memory cells having a threshold voltage higher than the off-cell threshold voltage Count_Vth in the third state Pc, and may determine it as the off-cell count value Count_Val.

Referring to FIGS. 2 and 8 again, the counter 210 sends the calculated (determined) off-cell count value Count_Val to the comparator 220. The comparator 220 may transmit a reference command Ref_Cmd to the OTP memory cell array 420 and receive the reference count value Ref_Count stored in the OTP memory cell array 420. After that, the comparator 220 compares the off-cell count value Count_Val received from the counter 210 with the reference count value Ref_Count received from the OTP memory cell array 420 (S130). The reference count value Ref_Count may be specified as different values for each word line. After that, the comparator 220 determines the read level Read_lv to be applied to the sixth word line WL6, on the basis of the result obtained by comparing the off-cell count value Count_Val with the reference count value Ref_Count (S140). The operation (S140) of determining the read level Read_lv to be applied to the sixth word line WL6, on the basis of the result obtained by comparing the off-cell count value Count_Val with the reference count value Ref_Count using the comparator 220 will be hereinafter described with reference to FIG. 10.

Figure 10:
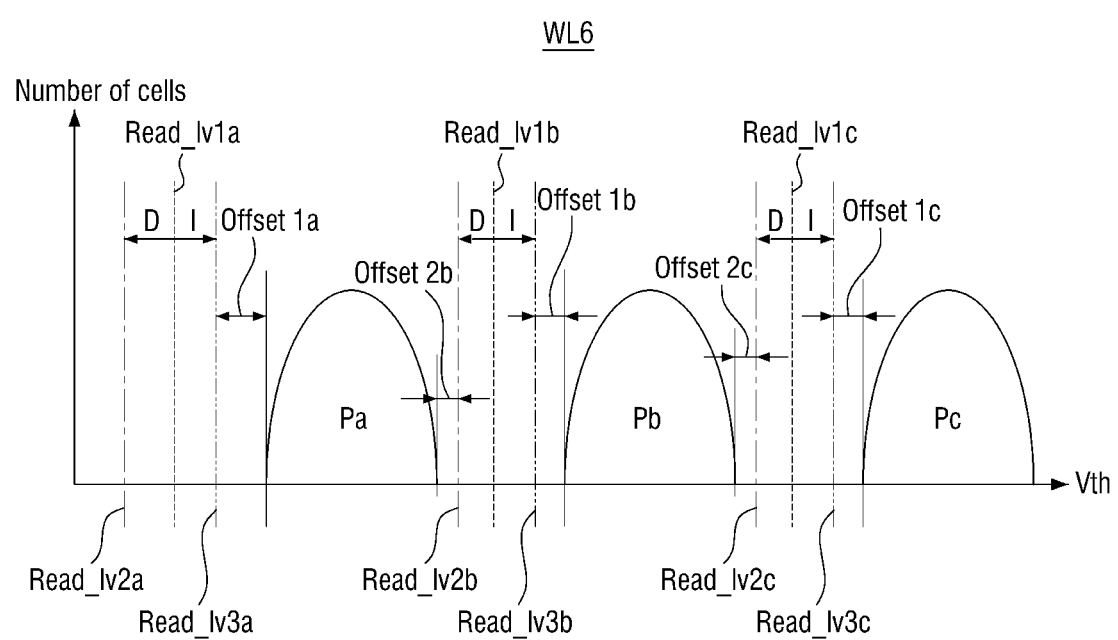
FIG. 10 illustrates a diagram showing how the storage device determines the read level on the basis of the off-cell count value according to embodiments of the inventive concepts.

FIG. 10 illustrates a diagram showing how the storage device determines the read level on the basis of the off-cell count value according to embodiments of the inventive concepts.

Referring to FIGS. 2 and 10, the memory cells connected to the sixth word line WL6 are assumed to be multi-level cells MLC, and the threshold voltage distribution of the erase state E is omitted for the sake of simplicity of drawing.

A predetermined read level is shown by read levels Read_lv1a, Read_lv1b, and Read_lv1c represented as the dotted line, before the storage device 1 according to some embodiments generates a read level Read_lv to be applied to the sixth word line WL6 through the read level generator 200.

Each of the read levels Read_lv1a, Read_lv1b, and Read_lv1c may be pre-specified read levels for reading the first state Pa, second state Pb, and third state Pc, respectively.

The comparator 220 compares the off-cell count value Count_Val with the reference count value Ref_Count, and when the off-cell count value Count_Val is determined to be smaller (or smaller than or equal to) the reference count value Ref_Count, the comparator 220 may lower the respective read levels Read_lv1a, Read_lv1b, and Read_lv1c in the direction D. That is, read levels Read_lv2a, Read_lv2b, and Read_lv2c adjusted through the comparator 220 may have a read level that is lower by D than the pre-specified read levels Read_lv1a, Read_lv1b, and Read_lv1c.

In this case, the adjusted read levels Read_lv2a, Read_lv2b, and Read_lv2c need to have a state lower than the state to be read by each of the read levels Read_lv2a, Read_lv2b, and Read_lv2c, and a certain margin (or a lower offset voltage). For example, the adjusted read voltage Read_lv2b for reading the second state Pb needs to have a difference (or be different) by a lower offset voltage Offset 2b from the highest threshold voltage of the first state Pa.

Also, the adjusted read voltage Read_lv2c for reading the third state Pc needs to have a difference (or be different) by a lower offset voltage Offset 2c from the highest threshold voltage of the second state Pb.

The comparator 220 compares the off-cell count value Count_Val with the reference count value Ref_Count, and when the off-cell count value Count_Val is determined to be greater than or equal to (or greater than) the reference count value Ref_Count, the comparator 220 may increase each of the read levels Read_lv1a, Read_lv1b, and Read_lv1c in the direction I. That is, read levels Read_lv3a, Read_lv3b, and Read_lv3c adjusted through the comparator 220 may have a read level which is higher by I than the pre-specified read levels Read_lv1a, Read_lv1b, and Read_lv1c.

In this case, the adjusted read levels Read_lv3a, Read_lv3b, and Read_lv3c need to have a certain margin (or an upper offset voltage) difference from the state to be read by each of the read levels Read_lv3a, Read_lv3b, and Read_lv3c. For example, the adjusted read voltage Read_lv3a for reading the first state Pa needs to have a difference (or be different) by the upper offset voltage Offset 1a from the lowest threshold voltage of the first state Pa. Also, the adjusted read voltage Read_lv3b for reading the second state Pb needs to have a difference (or be different) by the upper offset voltage Offset 1b from the lowest threshold voltage of the second state Pb. Also, the adjusted read voltage Read_lv3c for reading the third state Pc needs to have a difference (or be different) by the upper offset voltage Offset 1c from the lowest threshold voltage of the third state Pc.

Referring to FIGS. 2 and 8 again, the storage device 1 according to some embodiments performs the read operation on the sixth word line WL6 using the adjusted read voltage Vread generated through the read level generator 200 (S150).

The operation of the storage device 1 according to some embodiments will be described hereinafter with reference to a ladder diagram of FIG. 11. Hereinafter, repeated description will be omitted for brevity.

Figure 11:
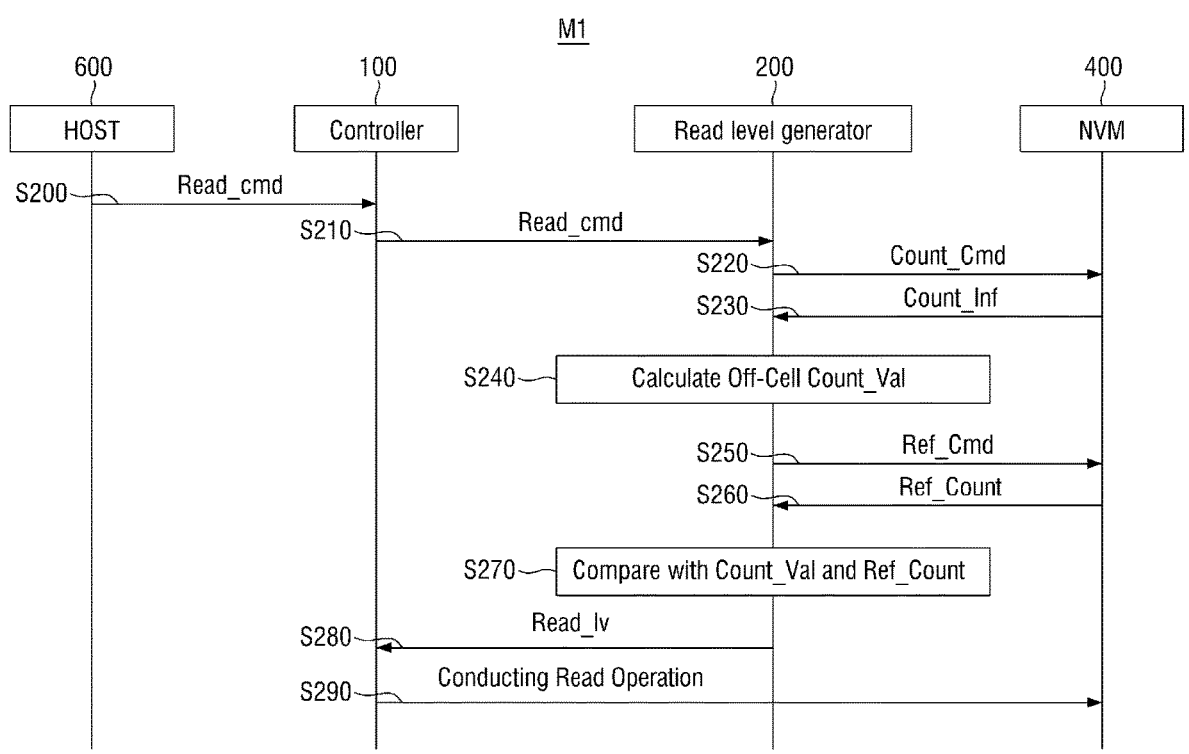
FIG. 11 illustrates a ladder diagram showing a read operation of the storage device according to embodiments of the inventive concepts.

FIG. 11 illustrates a ladder diagram M1 showing the read operation of the storage device according to embodiments of the inventive concepts.

Referring to FIGS. 1, 2 and 11, the controller 100 receives a read command Read_cmd from an external device (e.g., the host 600) of the storage device 1 according to some embodiments (S200). The controller 100 transmits the received read command Read_cmd to the read level generator 200 (S210). The read level generator 200, more specifically the counter 210, sends the count command Count_Cmd to the nonvolatile memory device 400 to obtain threshold voltage distribution information of the memory cells connected to the word line which is adjacent to the word line to which the memory cell targeted by the read command Read_cmd is connected (S220). From the nonvolatile memory device 400, and more specifically from the nonvolatile memory cell array 410, count information Count_inf, including information on the adjacent word line, is transmitted to the read level generator 200 (S230). After that, the read level generator 200, more specifically the counter 210, calculates the off-cell count value Count_Val of the memory cells connected to the adjacent word line through the count information Count_inf. Thereafter, the read level generator 200, more specifically the comparator 220, sends a reference command Ref_Cmd which requests the reference count Ref_count to the nonvolatile memory device 400, more specifically to the OTP memory cell array 420 (S250). After that, the nonvolatile memory device 400, more specifically the OTP memory cell array 420, transmits the reference count Ref_count stored in the OTP memory cell array 420 to the read level generator 200 (S260). The comparator 220 that has received the reference count Ref_count value and the off-cell count Count_Val value compares the off-cell count value Count_Val with the reference count value Ref_Count (S270). The read level generator 200, more specifically the comparator 220, sends the generated read level Read_lv to the controller 100 (S280). The controller 100 performs the read operation of the nonvolatile memory device 400 on the basis of the read level Read_lv (S290).

Figure 12:
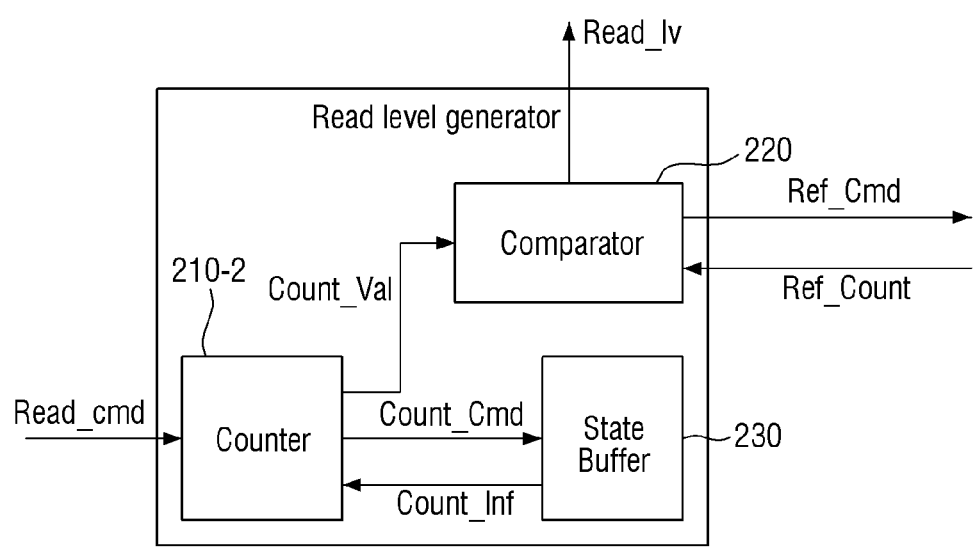
FIG. 12 illustrates a block diagram of another read level generator according to embodiments of the inventive concepts.

FIG. 12 illustrates a block diagram of another read level generator according to embodiments of the inventive concepts.

Referring to FIG. 12, another read level generator 200-2 according to some embodiments may further include a state buffer 230, different than the read level generator 200 of FIG. 2. The state buffer 230 may include DRAM and/or SRAM.

The state buffer 230 may temporarily store the count information Count_inf of the memory cells connected to the word line which is adjacent to the word line to which the memory cell targeted by the read command Read_cmd is connected. That is, different than the counter 210 of FIG. 2, the counter 210-2 of the storage device in FIG. 12 which includes read level generator 200-2 may transmit the count command Count_Cmd to the state buffer 230, and may receive the count information Count_inf including the adjacent word line information from state buffer 230. Therefore, the counter 210-2 does not need to access to the nonvolatile memory device, the speed at which the read level generator 200-2 generates the read level Read_lv can become faster, and eventually, the operating speed of the storage device according to the embodiment can be improved.

Since the operation after the counter 210-2 in the read level generator 200-2 in FIG. 12 receives the count information Count_inf is substantially the same as described with respect to corresponding operation as described with respect to counter 210 of FIG. 2, repeated description is here omitted for brevity.

Figure 13:
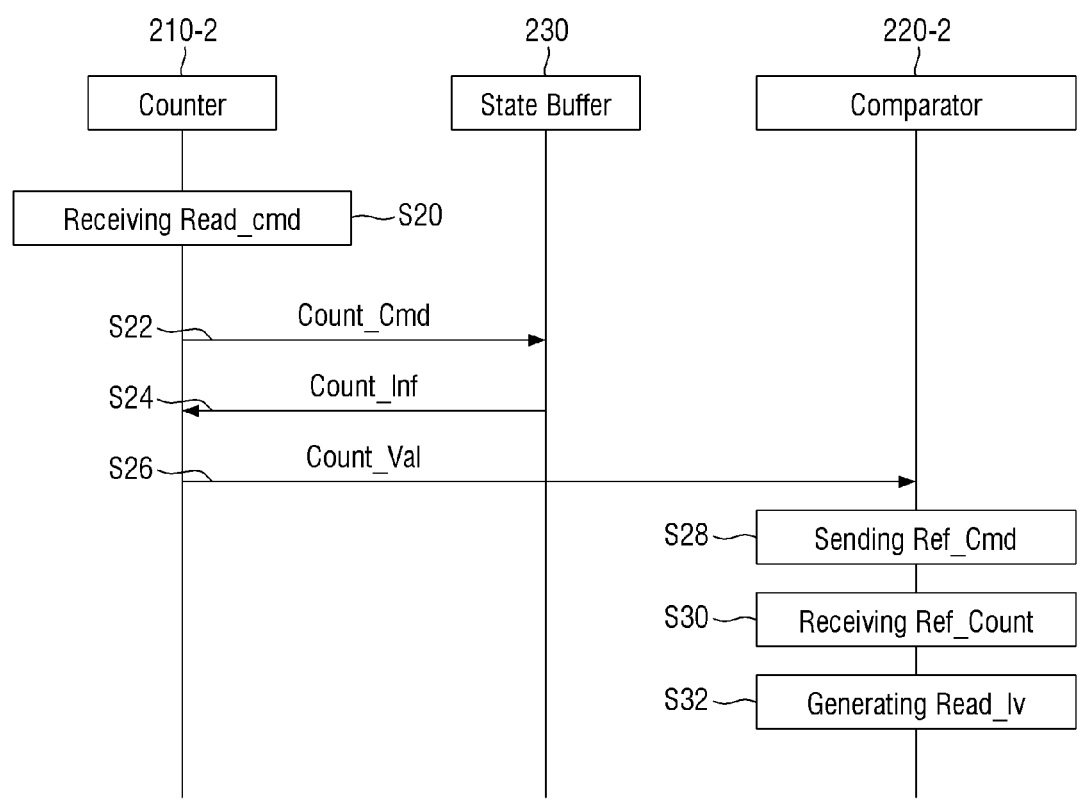
FIG. 13 illustrates a ladder diagram showing a read level generation operation using the read level generator of FIG. 12 according to embodiments of the inventive concepts.

FIG. 13 illustrates a ladder diagram showing a read level generation operation using the read level generator of FIG. 12 according to embodiments of the inventive concepts.

Referring to FIG. 13, the counter 210-2 of read level generator 200-2 in FIG. 12 receives a read command (S20). After that, the counter 210-2 sends the count command Count_Cmd to the state buffer 230 (S22). The state buffer 230, to which the count command Count_Cmd is sent, sends the count information Count_inf including the adjacent word line information stored in advance to the counter 210-2 (S24). The counter 210-2 calculates the off-cell count value Count_Val of the adjacent word line, using the received count information Count_inf, and sends it to the comparator 220-2 (S26). Since subsequent steps S28, S30, and S32 are similar to the description of steps S250, S260 and S270 in FIG. 11, repeated description is here omitted for brevity.

Figure 14:
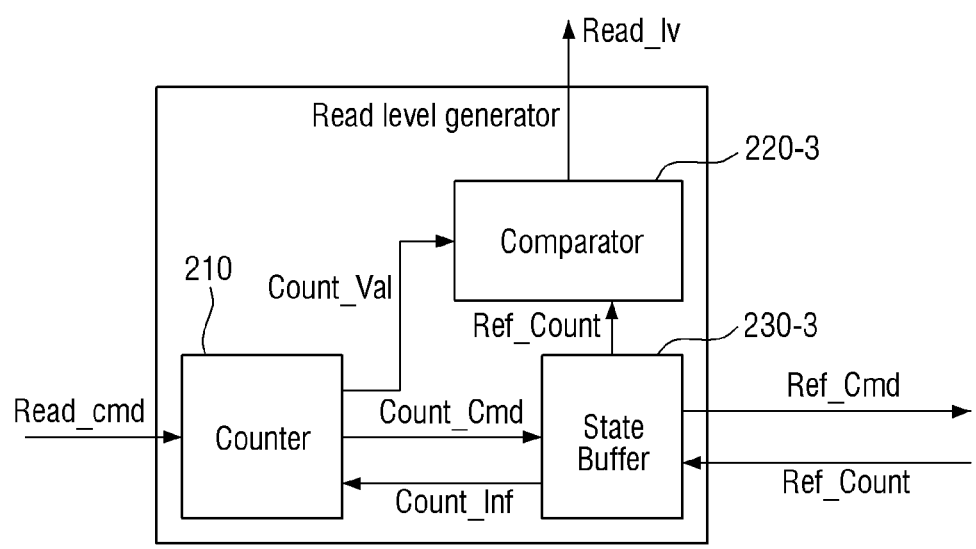
FIG. 14 illustrates a block diagram of another read level generator according to embodiments of the inventive concepts.

FIG. 14 illustrates a block diagram of another read level generator according to embodiments of the inventive concepts.

Referring to FIG. 14, a read level generator 200-3 according to some embodiments further includes a state buffer 230, different than the read level generator 200 of FIG. 2. Also, unlike the read level generator 200-2 of FIG. 12, in the read level generator 200-3 according to some embodiments, the state buffer 230-3 sends the reference command Ref_Cmd to the OTP memory cell array 420, receives the value of reference count Ref_count and stores it temporarily.

That is, the comparator 220-3 of the read level generator 200-3 in FIG. 14 according to some embodiments may receive the reference count Ref_count value from the state buffer 230-3, different than the comparator 220 of FIG. 2. Therefore, the comparator 220-3 does not need to access to the nonvolatile memory device 400, the speed at which the read level generator 200-3 generates the read level Read_lv can become faster, and eventually, the operating speed of the storage device according to the embodiment can be improved.

Since the operation after the comparator 220-3 of FIG. 14 receives the reference count Ref_count value is similar to the description with reference to comparator 220 of FIG. 2, repeated description is here omitted for brevity.

Figure 15:
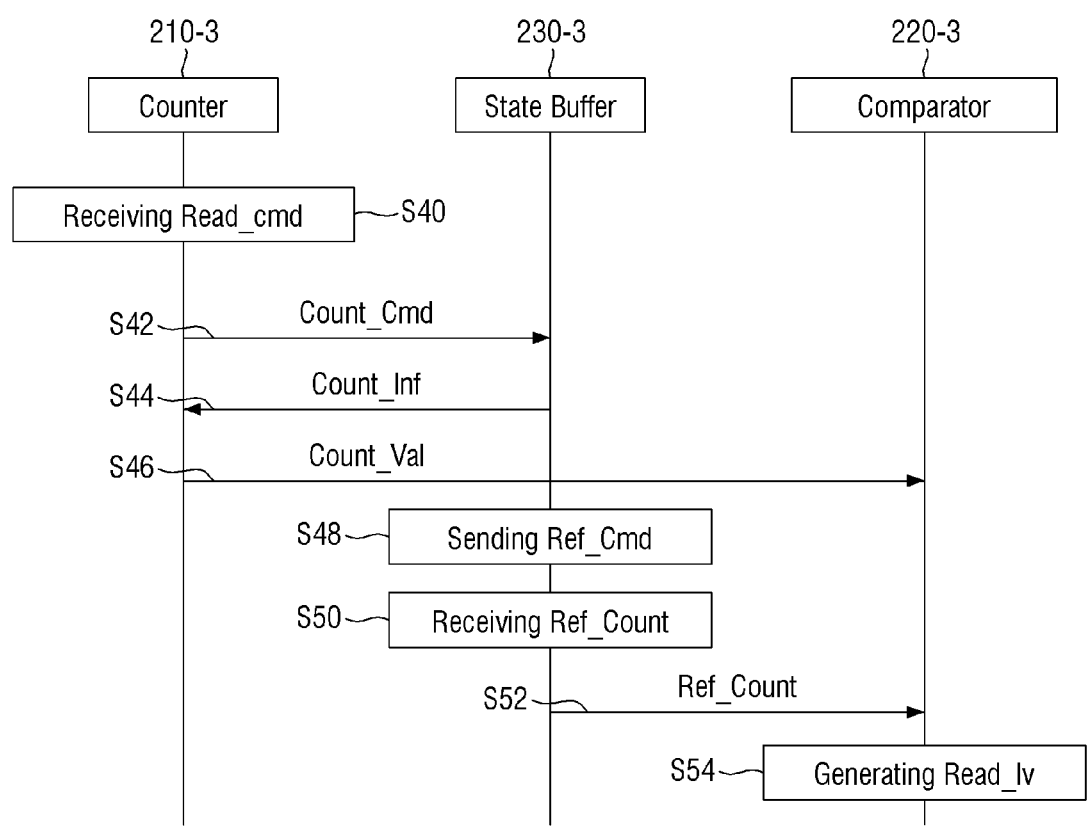
FIG. 15 illustrates a ladder diagram showing a read level generation operation using the read level generator of FIG. 14 according to embodiments of the inventive concepts.

FIG. 15 illustrates a ladder diagram showing a read level generation operation using the read level generator of FIG. 14 according to embodiments of the inventive concepts.

Since steps S40, S42, S44, and S46 in FIG. 15 are respectively the same as steps S20, S22, S24, and S26 of FIG. 13, repeated description is here omitted for brevity.

The state buffer 230-3 sends a reference command Ref_Cmd to the OTP memory cell array 420 (S48). After that, the state buffer 230-3 receives the reference count Ref_count value and stores it temporarily (S50). After that, the state buffer 230-3 sends the reference count Ref_count value to the comparator 220-3 (S52). After that, the comparator 220-3 compares the reference count Ref_count value with the off-cell count Count_Val value to generate the read level Read_lv (S54).

The configuration and operation of the comparators 200-2 and 200-3 described above may be applied to another storage device according to some embodiments described hereinafter.

Figure 16:
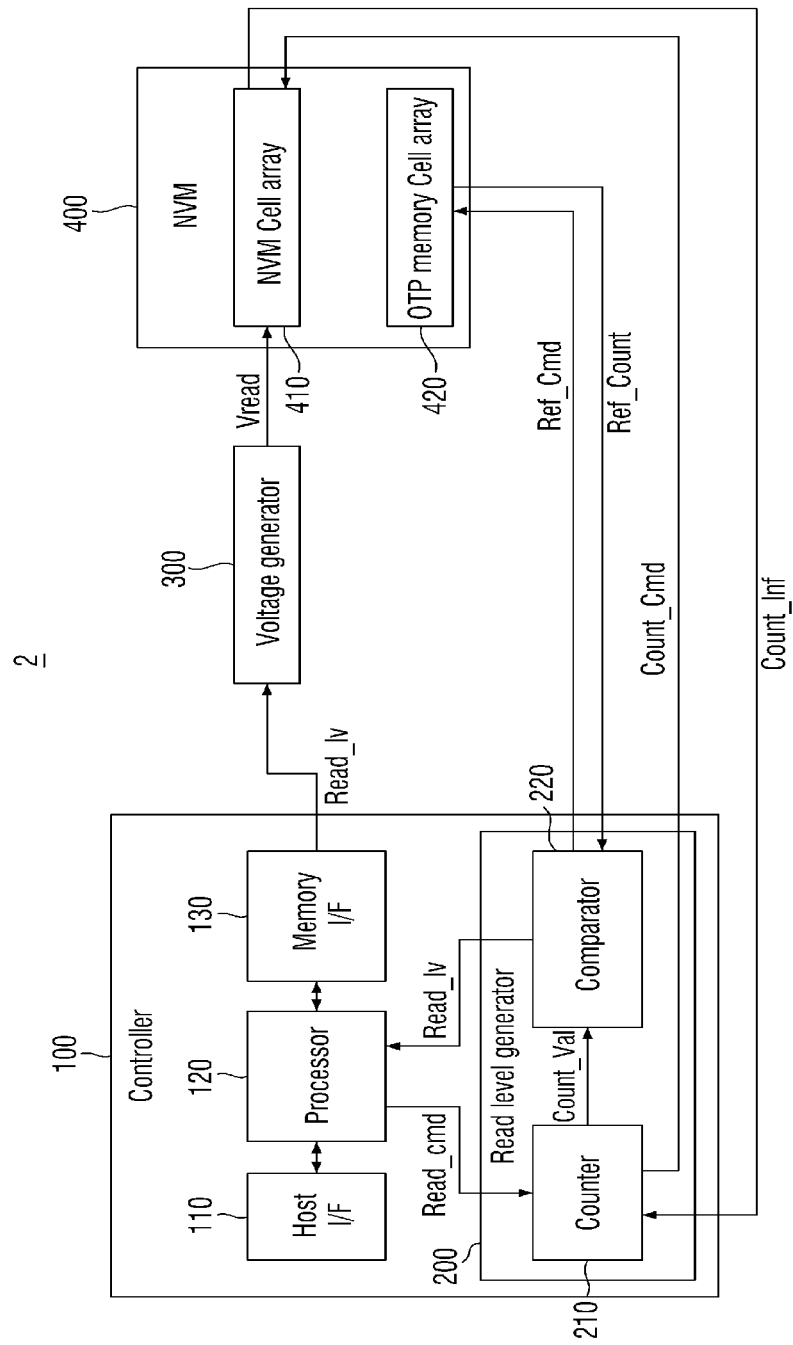
FIG. 16 illustrates a block diagram of another storage device according to embodiments of the inventive concepts.
Figure 17:
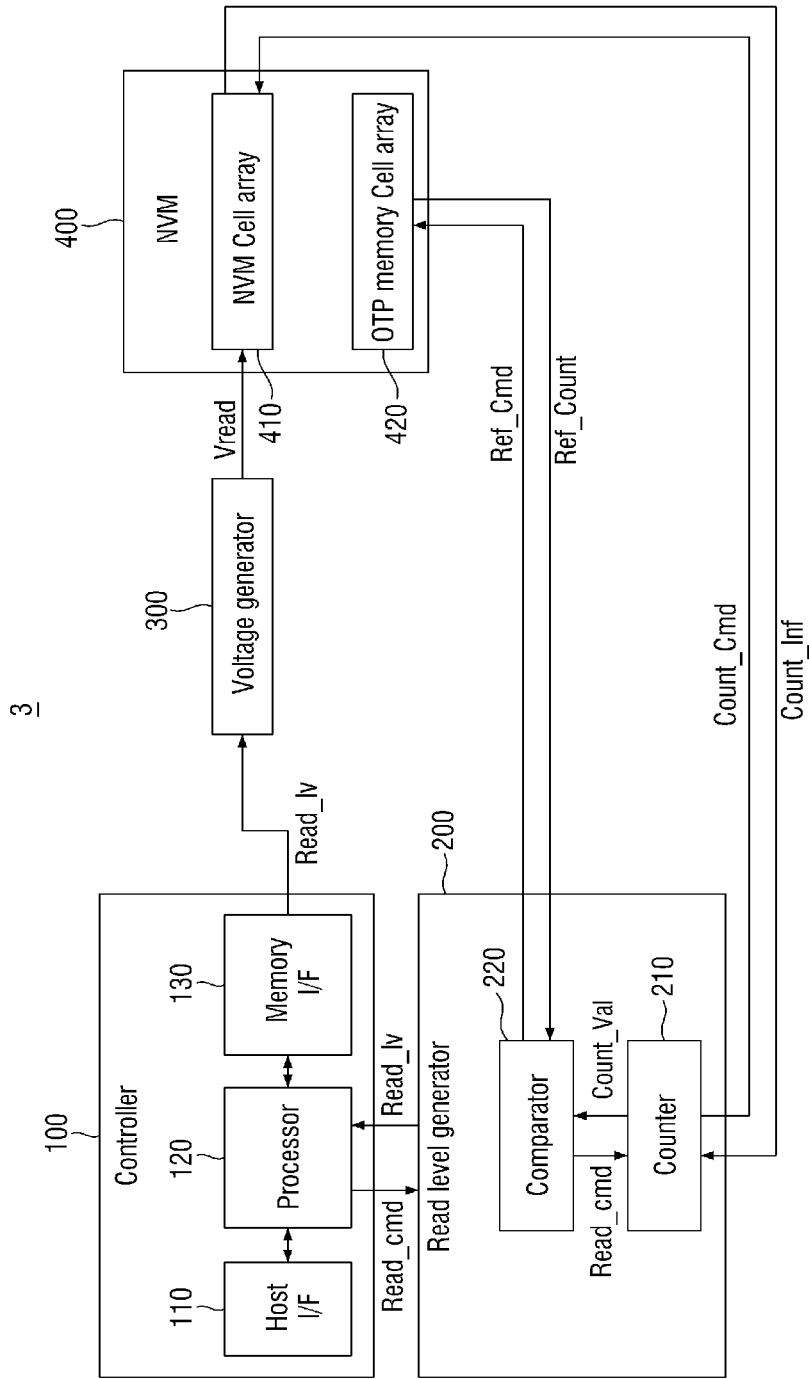
FIG. 17 illustrates a block diagram of another storage device according to embodiments of the inventive concepts.

FIGS. 16 and 17 are exemplary block diagrams showing other storage devices according to embodiments of the inventive concepts.

Referring to FIG. 16, different than the storage device 1 such as described with respect to FIG. 2, according to some embodiments the read level generator 200 of another storage device 2 may be included inside the controller 100. Since other configurations and operations are similar to those described with respect to FIG. 2, repeated description is here omitted for brevity.

Referring to FIG. 17, different than the storage device 1 such as described with respect to FIG. 2, in another storage device 3 according to some embodiments the comparator 220 may receive the read command Read_cmd before the counter 210. Although the structure of the storage device 3 may be similar to that of the storage device 1 in FIG. 2, since the operation sequences are different from each other, differences in operation sequences will be hereinafter described with reference to FIG. 18.

Figure 18:
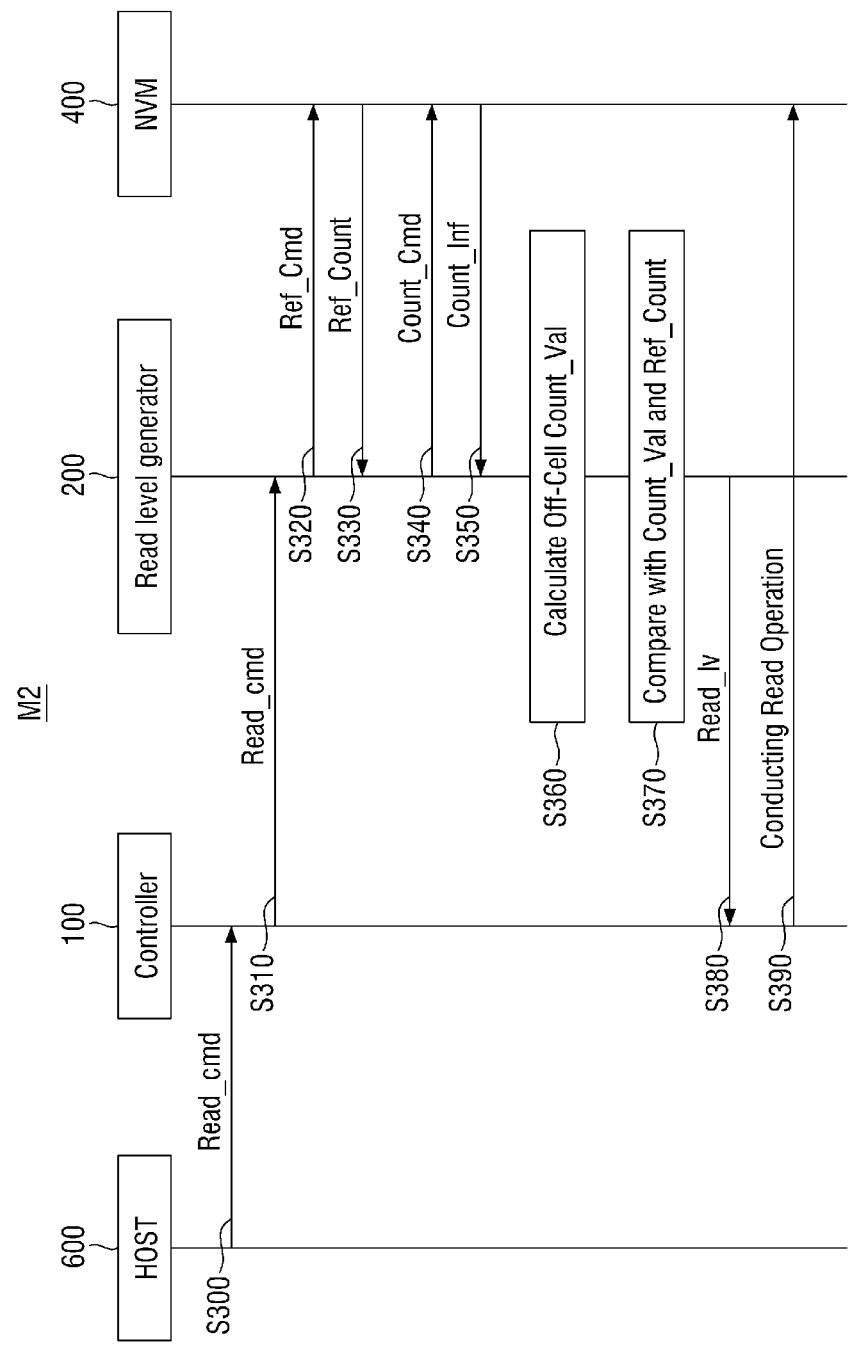
FIG. 18 illustrates a ladder diagram showing a read operation of the storage device of FIG. 17 according to embodiments of the inventive concepts.

FIG. 18 illustrates an exemplary ladder diagram showing the read operation of the storage device of FIG. 17 according to embodiments of the inventive concepts.

Referring to FIG. 18, since steps S300 and S310 are similar to steps S200 and S210 of FIG. 11, description of these steps will be omitted. However, in the operating method M2 shown in FIG. 18, the comparator 220 of the read level generator 200 may receive the read command Read_cmd before the counter 210 receives the read command Read_cmd.

The comparator 220 sends the reference command Ref_Cmd to the nonvolatile memory device 400 (S320). The reference count Ref_count stored in the nonvolatile memory device 400, more specifically in the OTP memory cell array 420, is sent to the comparator 220 (S330). Subsequent steps S340, S350, S360, S370, S380, and S390 in FIG. 18 are similar to respective steps S220, S230, S240, S270, S280, and S290 of FIG. 11, repeated description is here omitted for brevity.

Figure 19:
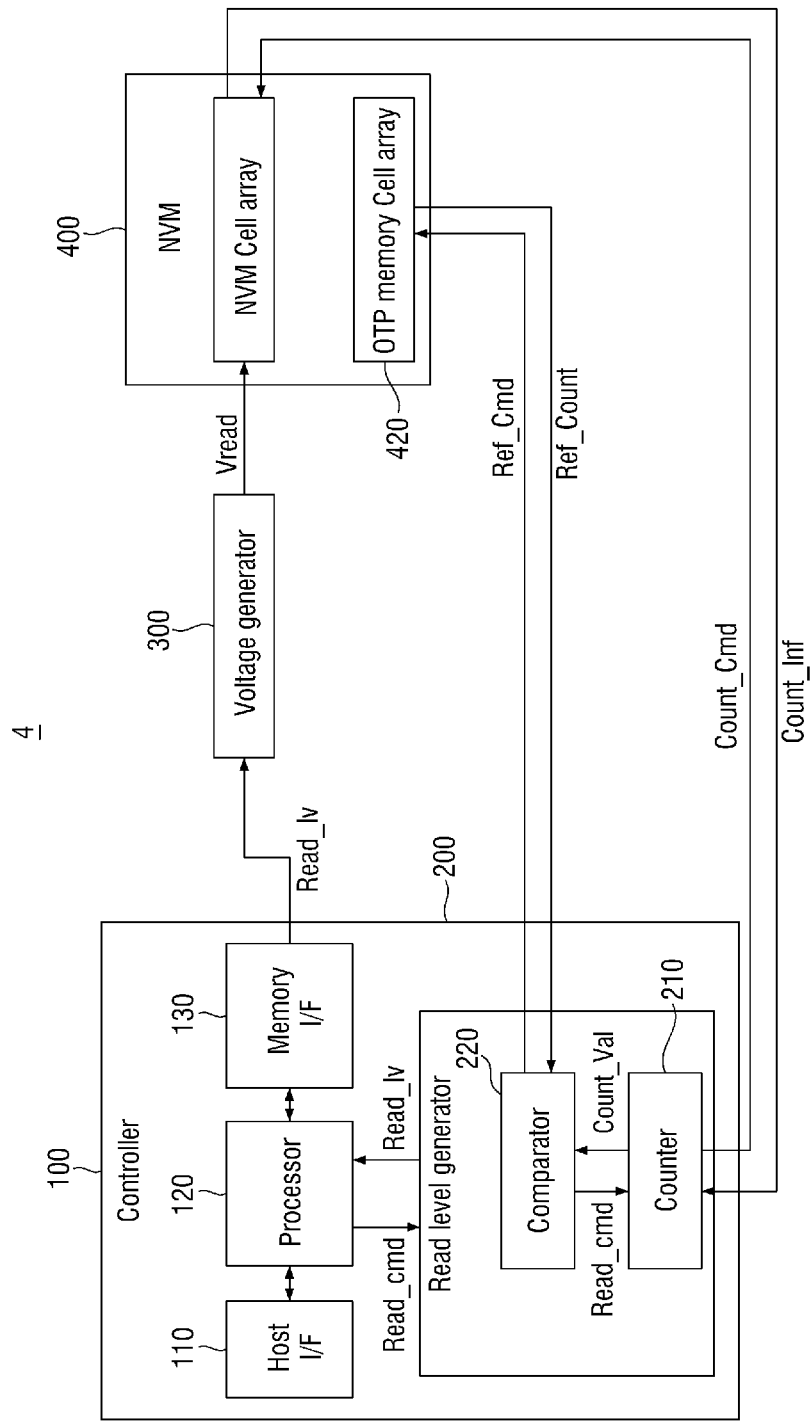
FIG. 19 illustrates a block diagram of another storage device according to embodiments of the inventive concepts.
Figure 20:
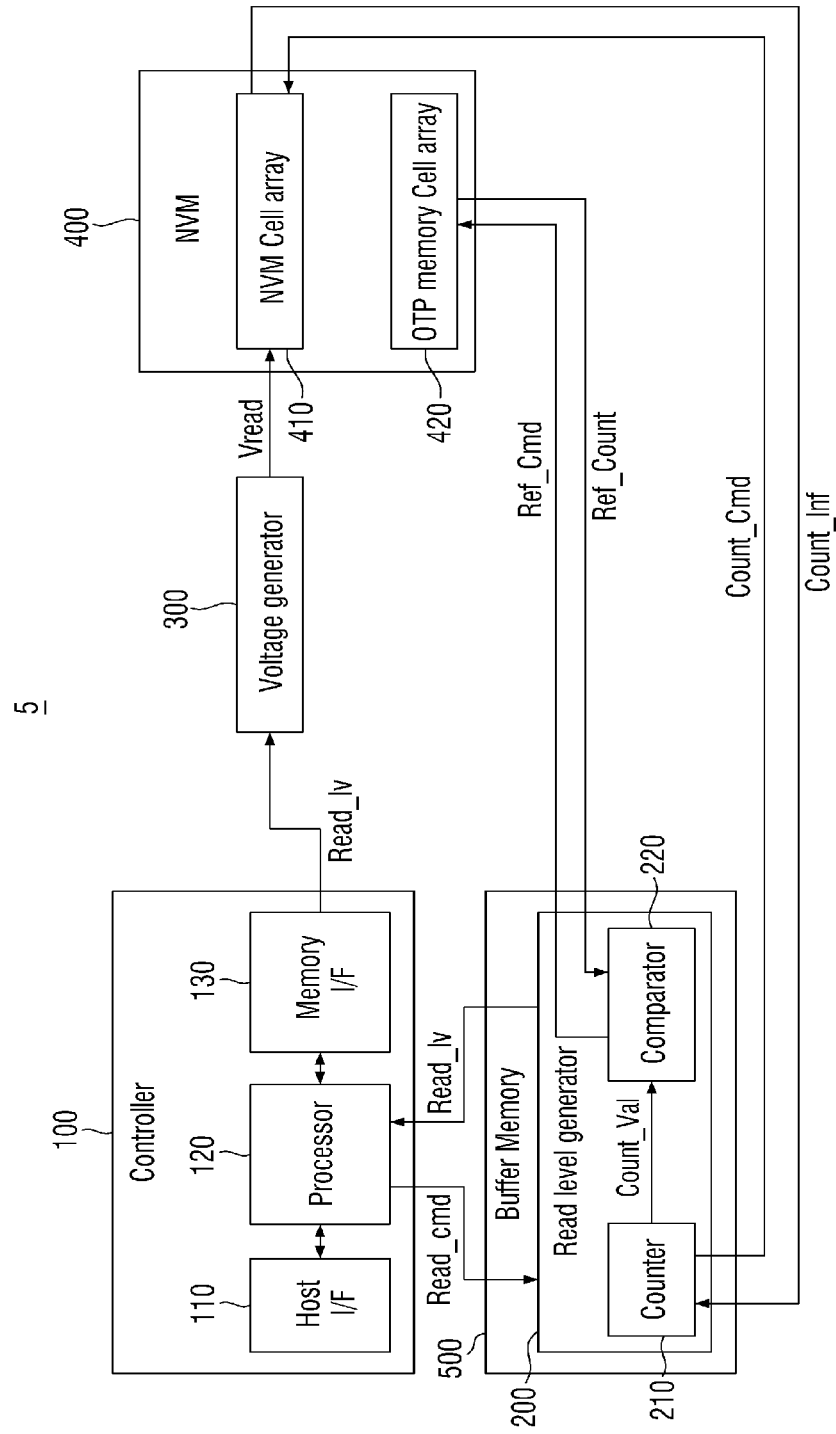
FIG. 20 illustrates a block diagram of another storage device according to embodiments of the inventive concepts.

FIGS. 19 and 20 illustrate block diagrams of other storage devices according to embodiments of the inventive concepts.

Referring to FIG. 19, different than storage device 3 described with respect to FIG. 17, the read level generator 200 of another storage device 4 according to some embodiments may be included inside the controller 100. Since other configurations and operations in FIG. 19 are similar to those of FIG. 17, repeated description is here omitted for brevity.

Referring to FIG. 20, different than the storage device 1 according to FIG. 2, the read level generator 200 of another storage device 5 according to some embodiments may be included in a buffer memory 500.

The buffer memory 500 may store codes and commands which are executed by the processor 120. The buffer memory 500 may store data which are processed by the processor 120. The buffer memory 500 may be a random access memory (RAM). A flash conversion layer (FTL) or various memory management modules may be stored in buffer memory 500. The flash conversion layer (FTL) may perform address mapping, garbage collection, wear leveling, and the like which are performed for an interface between the nonvolatile memory device 400 and the external device (e.g., HOST 600).

The read level generator 200 may be stored in the buffer memory 500. The read level generator 200 may be executed by the processor 120. According to the execution of the read level generator 200 by the processor 120, the controller 100 may determine the read level Read_lv to be applied to the memory cell targeted by the read command Read_cmd through the read level generator 200, in accordance with changes in read level due to various deteriorations that occur in the nonvolatile memory device 400. Since the operating method of the read level generator 200 in FIG. 20 is similar to that described with respect to the storage device 1 in FIG. 2, repeated description is here omitted for brevity.

The read level generator 200 may be loaded to the buffer memory 500 and executed, under the control of the processor 120. As an example, when the read level generator 200 is implemented as firmware, the read level generator 200 is stored in nonvolatile memory device 400, and then may be loaded into buffer memory 500 and executed by the processor 120. Or, the read level generator 200 may be implemented as hardware for example by an ASIC (application specific integrated circuit), an FPGA (field programmable gate array), or the like.

Those skilled in the art should appreciate that many variations and modifications may be made to the disclosed embodiments without substantially departing from the principles of the present inventive concept. Therefore, the disclosed embodiments of the inventive concepts are used in a generic and descriptive sense only and not for purposes of limitation.

What is claimed is:
1. A storage device comprising:
a nonvolatile memory device comprising a nonvolatile memory cell array including a string including a first memory cell and a second memory cell stacked sequentially in a first direction, and an OTP memory cell array configured to store reference count values, the first memory cell connected to a first word line and the second memory cell connected to a second word line;

a controller comprising a processor configured to generate a read command for the first memory cell; and a read level generator comprising a counter configured to receive the read command and calculate an off-cell count value of memory cells connected to the second word line, and a comparator configured to receive a first reference count value from among the reference count values stored in the OTP memory cell array, compare the off-cell count value with the first reference count value to determine a threshold voltage shift of the second memory cell, and determine a read level of the first memory cell based on the threshold voltage shift.

2. The storage device of claim 1, further comprising a voltage generator configured to send a read voltage generated based on the read level to the nonvolatile memory cell array.

3. The storage device of claim 1, further comprising a buffer memory, the read level generator disposed inside the buffer memory.

4. The storage device of claim 1, wherein the read level generator is configured to increase the read level when the off-cell count value is greater than the first reference count value.

5. The storage device of claim 4, wherein a difference between the increased read level and a minimum threshold voltage of a first state of the first memory cell to be read responsive to the read command is greater than or equal to an upper offset voltage.

6. The storage device of claim 1, wherein the read level generator is configured to reduce the read level when the off-cell count value is smaller than the first reference count value.

7. The storage device of claim 6, wherein a difference between the reduced read level and a maximum threshold voltage of a second state having a threshold voltage distribution lower than a first state of the first memory cell to be read responsive to the read command is greater than or equal to a lower offset voltage.

8. The storage device of claim 1, wherein the OTP memory cell array stores the first reference count value which is compared with the off-cell count value of the memory cells connected to the second word line, and a second reference count value which is compared with an off-cell count value of memory cells connected to the first word line.

9. The storage device of claim 8, wherein the first reference count value and the second reference count value are different from each other.

10. The storage device of claim 1, wherein the off-cell count value calculated by the counter is an off-cell count value of a state having a highest threshold voltage distribution of the memory cells connected to the second word line.

11. The storage device of claim 1, wherein the string includes a third memory cell disposed between the first memory cell and the second memory cell.

12. The storage device of claim 1, wherein the read level generator is disposed inside the controller.

13. A storage device comprising:

a nonvolatile memory device comprising a nonvolatile memory cell array including a string including a first memory cell, a second memory cell and a string select transistor stacked sequentially in a first direction, and an OTP memory cell array including reference count values, the first memory cell connected to a first word line and the second memory cell connected to a second word line;

a controller connected to the nonvolatile memory device through a voltage generator; and a read level generator configured to receive a read command for the first memory cell from the controller, generate a read level for the first memory cell, and transmit the read level to the controller, wherein the nonvolatile memory device perform a read operation of the first memory cell responsive to the read command, the read level generator comprising a counter configured to receive the read command and calculate an off-cell count value of memory cells connected to the second word line, and the read level generator further comprising a comparator configured to receive a first reference count value from among the reference count values stored in the OTP memory cell array, compare the off-cell count value with the first reference count value to determine a threshold voltage shift of the second memory cell, and determine the read level of the first memory cell based on the threshold voltage shift.

14. The storage device of claim 13, further comprising a buffer memory, the read level generator disposed inside the buffer memory.

15. The storage device of claim 13, wherein the read level generator is configured to increase the read level when the off-cell count value is greater than the first reference count value, and a difference between the increased read level and a minimum threshold voltage of a first state of the first memory cell to be read responsive to the read command is greater than or equal to an upper offset voltage.

16. The storage device of claim 13, wherein the read level generator is configured to reduce the read level when the off-cell count value is smaller than the first reference count value, and a difference between the reduced read level and a maximum threshold voltage of a second state having a threshold voltage distribution lower than a first state of the first memory cell to be read responsive to the read command is greater than or equal to a lower offset voltage.

17. The storage device of claim 13, wherein the OTP memory cell array stores the first reference count value which is compared with the off-cell count value of the memory cells connected to the second word line, and a second reference count value which is compared with an off-cell count value of memory cells connected to the first word line, wherein the first reference count is different from the second reference count.

18. The storage device of claim 13, wherein the off-cell count value calculated by the counter is an off-cell count value of a state having a highest threshold voltage distribution of the memory cells connected to the second word line.

19. A storage device comprising:

a nonvolatile memory device comprising a nonvolatile memory cell array including a string including a first memory cell and a second memory cell stacked sequentially in a first direction, and an OTP memory cell array configured to store reference count values, the first memory cell connected to a first word line and the second memory cell connected to a second word line;

a counter configured to receive a read command for the first memory cell and calculate an off-cell count value of the memory cells connected to the second word line; and a comparator configured to receive a first reference count value from among the reference count values stored in the OTP memory cell array, compare the off-cell count value with the first reference count value to determine a threshold voltage shift of the second memory cell, and determine a read level of the first memory cell based on the threshold voltage shift.

20. The storage device of claim 19, further comprising a voltage generator configured to send a read voltage generated based on the read level to the nonvolatile memory cell array.

* * * * *